US010403562B2

(12) United States Patent
Baek et al.

(10) Patent No.: US 10,403,562 B2
(45) Date of Patent: Sep. 3, 2019

(54) FAN-OUT SEMICONDUCTOR PACKAGE MODULE

(71) Applicant: SAMSUNG ELECTRONICS CO., LTD., Suwon-si (KR)

(72) Inventors: Yong Ho Baek, Suwon-Si (KR); Joo Hwan Jung, Suwon-Si (KR); Yoo Rim Cha, Suwon-Si (KR); Young Sik Hur, Suwon-Si (KR); Jung Chul Gong, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/943,200

(22) Filed: Apr. 2, 2018

(65) Prior Publication Data
US 2019/0131212 A1    May 2, 2019

(30) Foreign Application Priority Data
Oct. 31, 2017    (KR) .......................... 10-2017-0143840

(51) Int. Cl.
H01L 23/00    (2006.01)
H01L 23/48    (2006.01)
(Continued)

(52) U.S. Cl.
CPC ...... *H01L 23/481* (2013.01); *H01L 23/49827* (2013.01); *H01L 23/642* (2013.01);
(Continued)

(58) Field of Classification Search
CPC ..... H01L 23/28; H01L 23/31; H01L 23/3107; H01L 23/3121
See application file for complete search history.

(56) References Cited

U.S. PATENT DOCUMENTS 5,883,425 A * 3/1999 Kobayashi .............. H01L 21/50
257/678
6,546,620 B1 * 4/2003 Juskey .................... H01L 24/81
228/180.21
(Continued)

FOREIGN PATENT DOCUMENTS

CN    1267086 A    9/2000
CN    102969252 A    3/2013
(Continued)

OTHER PUBLICATIONS

Taiwanese Office Action dated Nov. 30, 2018 issued in Taiwanese Patent Application No. 107112424 (with English translation).
(Continued)

*Primary Examiner* — David A Zarneke
(74) *Attorney, Agent, or Firm* — Sughrue Mion, PLLC

(57) ABSTRACT

A fan-out semiconductor package module includes: a structure including a wiring member including wiring patterns, one or more first passive components disposed on the wiring member and electrically connected to the wiring pattern, and a first encapsulant encapsulating at least portions of each of the one or more first passive components, and having a first through-hole penetrating through the wiring member and the first encapsulant; a semiconductor chip disposed in the first through-hole of the structure and having an active surface having connection pads disposed thereon and an inactive surface opposing the active surface; a second encapsulant encapsulating at least portions of the semiconductor chip and filling at least portions of the first through-hole; and a connection member disposed on the structure and the active surface of the semiconductor chip and including a redistribution layer electrically connected to the connection pads and the wiring patterns.

20 Claims, 17 Drawing Sheets

(51) Int. Cl.
*H01L 23/64* (2006.01)
*H01L 23/498* (2006.01)

(52) U.S. Cl.
CPC .............. *H01L 24/06* (2013.01); *H01L 24/14* (2013.01); *H01L 24/44* (2013.01); *H01L 2224/02379* (2013.01); *H01L 2924/15174* (2013.01); *H01L 2924/182* (2013.01)

(56) References Cited

U.S. PATENT DOCUMENTS

| | | | | |
|---|---|---|---|---|
| 8,659,154 | B2* | 2/2014 | Meyer | H01L 21/561 257/738 |
| 8,749,073 | B2* | 6/2014 | Nakamura | H01L 21/4857 257/667 |
| 9,419,156 | B2* | 8/2016 | Lee | H01L 23/48 |
| 9,466,545 | B1 | 10/2016 | Scanlan et al. | |
| 9,583,409 | B2* | 2/2017 | Yokoyama | H01L 23/3135 |
| 9,653,415 | B2 | 5/2017 | Lee et al. | |
| 9,859,232 | B1* | 1/2018 | Chiang | H01L 23/3121 |
| 10,163,687 | B2* | 12/2018 | Rae | H01L 21/768 |
| 2002/0086500 | A1* | 7/2002 | Wu | H01L 23/3128 438/455 |
| 2005/0045369 | A1* | 3/2005 | Ishimaru | H01L 23/3135 174/250 |
| 2006/0113642 | A1* | 6/2006 | Kajiki | H01L 21/565 257/659 |
| 2007/0109757 | A1* | 5/2007 | Lee | H01L 23/3128 361/760 |
| 2010/0301473 | A1 | 12/2010 | Sasaoka | |
| 2011/0062584 | A1 | 3/2011 | Ishihara | |
| 2013/0049182 | A1 | 2/2013 | Gong et al. | |
| 2013/0099390 | A1* | 4/2013 | Kurita | H01L 21/6835 257/774 |
| 2014/0103527 | A1 | 4/2014 | Marimuthu | |
| 2014/0131753 | A1* | 5/2014 | Ishida | H01L 25/0753 257/98 |
| 2016/0043047 | A1 | 2/2016 | Shim et al. | |
| 2016/0113115 | A1 | 4/2016 | Kwon et al. | |
| 2017/0154854 | A1* | 6/2017 | Xiao | H01L 21/485 |
| 2017/0287825 | A1 | 10/2017 | Lee et al. | |
| 2018/0108618 | A1* | 4/2018 | Yamamoto | C23C 14/0036 |
| 2018/0177049 | A1* | 6/2018 | Vincent | H05K 1/115 |
| 2018/0294233 | A1* | 10/2018 | Yoon | H01L 21/565 |
| 2018/0331004 | A1* | 11/2018 | Guo | H01L 23/28 |

FOREIGN PATENT DOCUMENTS

| | | |
|---|---|---|
| CN | 105529324 A | 4/2016 |
| KR | 10-2011-0002074 A | 1/2011 |
| KR | 10-2012-0040039 A | 4/2012 |
| KR | 10-2015-0020714 A | 2/2015 |
| KR | 10-2017-0112363 A | 10/2017 |
| TW | 20161618196 A | 5/2016 |

OTHER PUBLICATIONS

Communication dated Mar. 28, 2019, issued by the Korean Intellectual Property Office in corresponding Korean Application No. 10-2017-0143840.

* cited by examiner

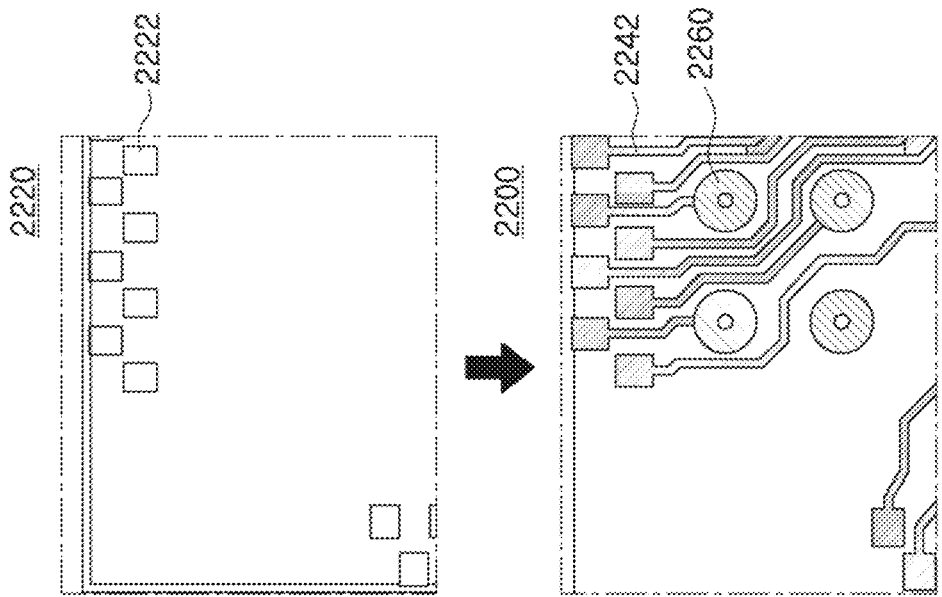
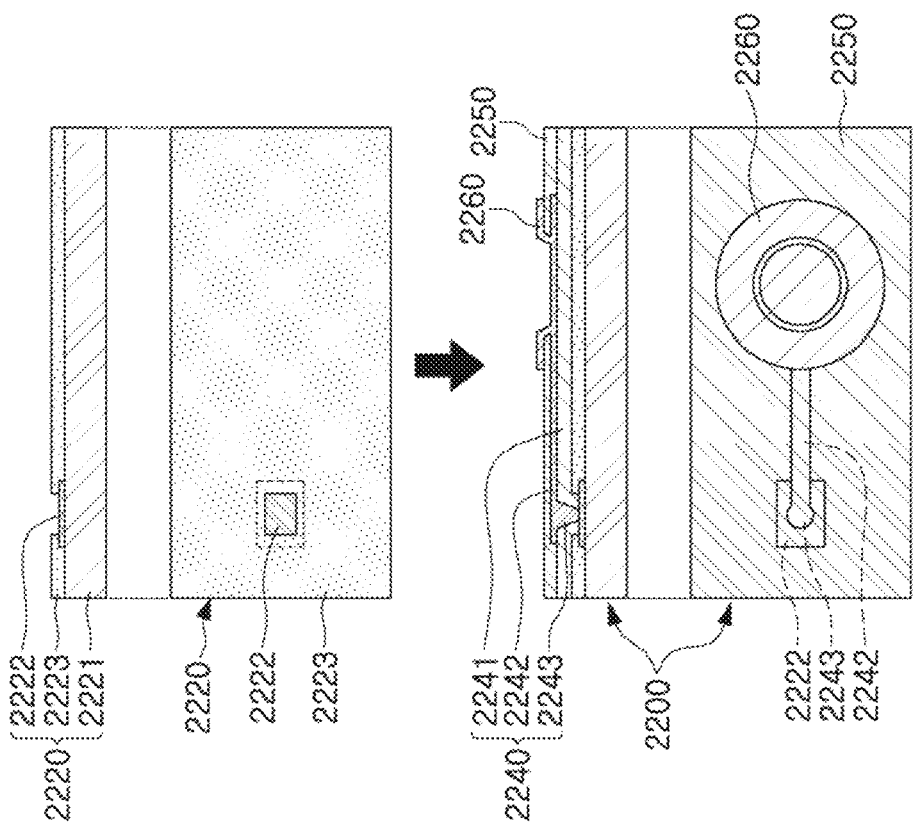
FIG. 3A
FIG. 3B

FAN-OUT SEMICONDUCTOR PACKAGE MODULE

CROSS-REFERENCE TO RELATED APPLICATION(S)

This application claims benefit of priority to Korean Patent Application No. 10-2017-0143840 filed on Oct. 31, 2017 in the Korean Intellectual Property Office, the disclosure of which is incorporated herein by reference in its entirety.

TECHNICAL FIELD

The present disclosure relates to a fan-out semiconductor package module in which a semiconductor chip is mounted and modularized together with a plurality of passive components in a single package.

BACKGROUND

In accordance with an increase in a size of displays for mobile apparatuses, the necessity to increase capacity of batteries has increased. In accordance with the increase in the capacity of the battery, an area occupied by the battery in the mobile apparatus has increased, and it has been thus required to reduce a size of a printed circuit board (PCB). Therefore, an area in which components are mounted has reduced, such that an interest in modularization has continuously increased.

Meanwhile, an example of the related art of mounting a plurality of components may include chip on board (COB) technology. A COB manner is a manner of mounting individual passive elements and a semiconductor package on a printed circuit board using surface mount technology (SMT). Such a manner has an advantage in terms of a cost, but a wide mounted area is required in order to maintain a minimum interval between components, electromagnetic interference (EMI) between the components is large, and a distance between the semiconductor chip and the components is great, such that electrical noise is increased.

SUMMARY

An aspect of the present disclosure may provide a fan-out semiconductor package module in which a mounted area of a semiconductor chip and a plurality of passive components may be significantly reduced, an electrical path between the semiconductor chip and the plurality of passive components may be significantly reduced, a yield problem may be solved, a problem occurring in mounting the passive components may be solved, and electromagnetic interference (EMI) blocking and heat dissipation effects may be easily implemented by plating.

According to an aspect of the present disclosure, a fan-out semiconductor package module may be provided, in which a plurality of passive components and a semiconductor chip are mounted and modularized together with each other in a single package, are encapsulated by two steps in a packaging process, and the passive components are disposed in a surface mounted form by introducing a separate wiring member. In addition, in the fan-out semiconductor package module having such a structure, EMI blocking and heat dissipation are promoted by plating, or the like.

According to an aspect of the present disclosure, a fan-out semiconductor package module may include: a structure including a wiring member including wiring patterns, one or more first passive components disposed on the wiring member and electrically connected to the wiring pattern, and a first encapsulant encapsulating at least portions of each of the one or more first passive components, and having a first through-hole penetrating through the wiring member and the first encapsulant; a semiconductor chip disposed in the first through-hole of the structure and having an active surface having connection pads disposed thereon and an inactive surface opposing the active surface; a second encapsulant encapsulating at least portions of the semiconductor chip and filling at least portions of the first through-hole; and a connection member disposed on the structure and the active surface of the semiconductor chip and including a redistribution layer electrically connected to the connection pads and the wiring patterns.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
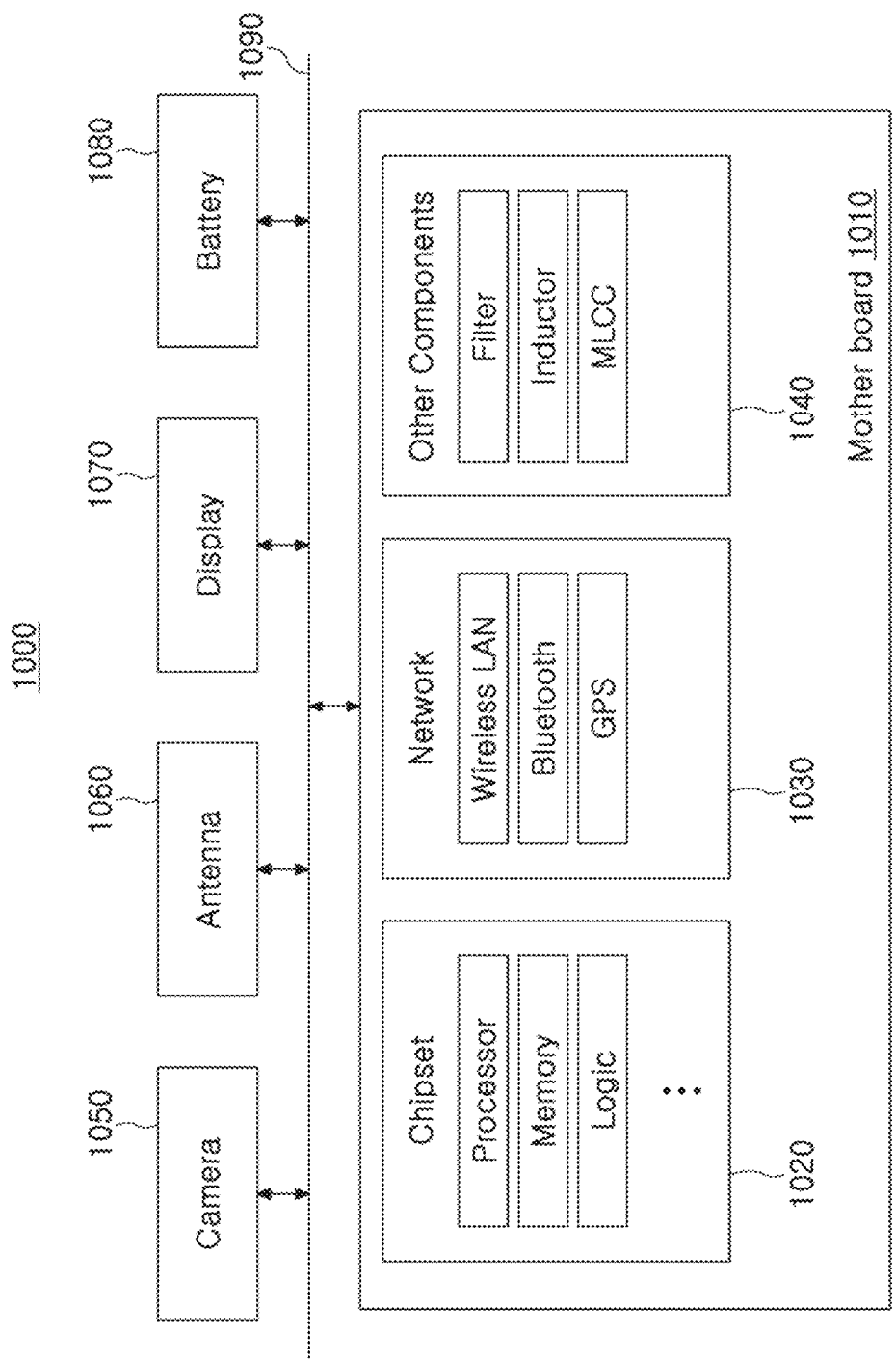
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 maybe combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component component, or the like. However, the electronic device 1000 is not limited thereto, and may be any other electronic device processing data.

Figure 2:
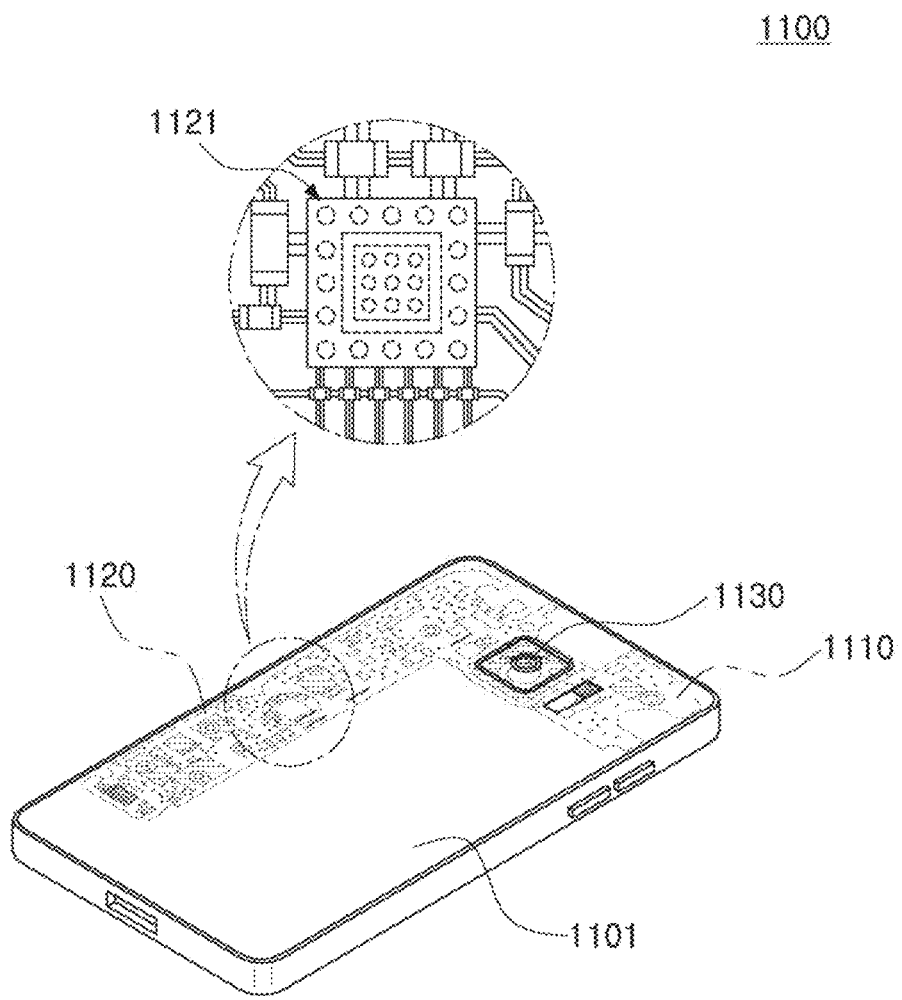
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described hereinafter in more detail with reference to the drawings.

Fan-In Semiconductor Package

FIGS. 3A and 3B are schematic cross-sectional views illustrating states of a fan-in semiconductor package before and after being packaged.

Figure 4:
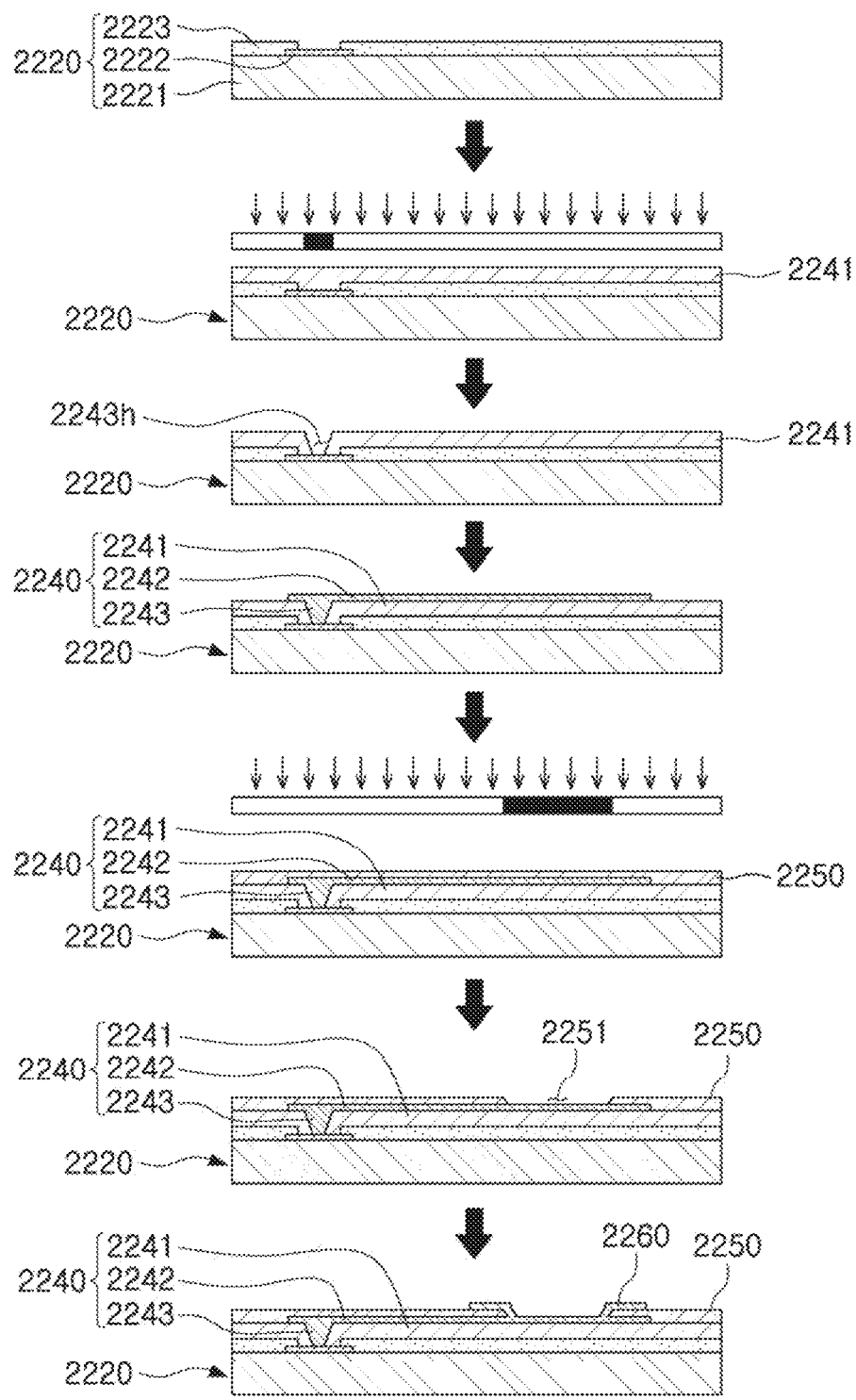
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
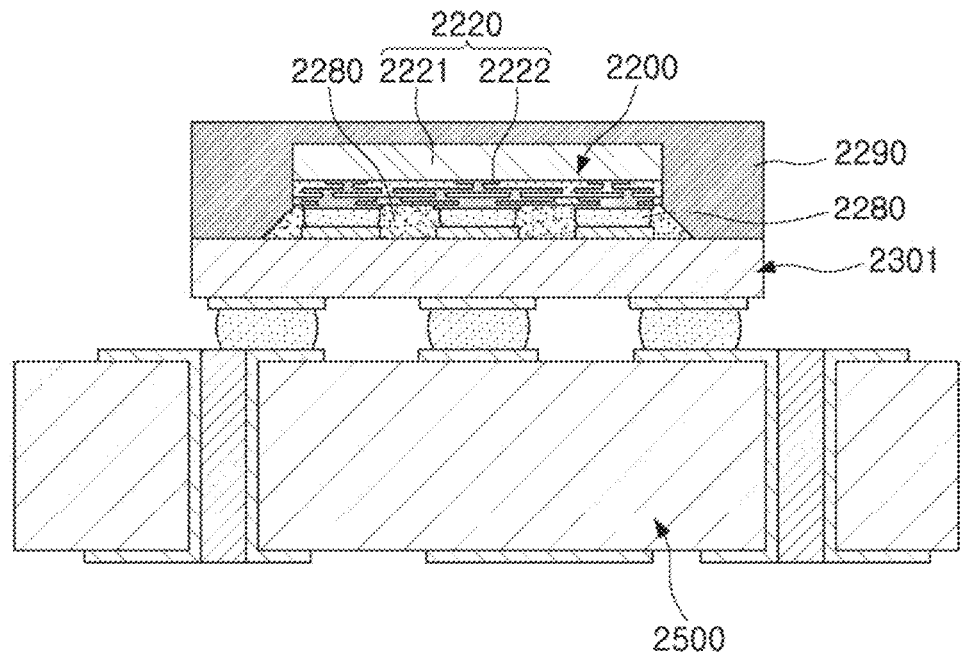
FIG. 5 is a schematic cross-sectional view illustrating a case in which a fan-in semiconductor package is mounted on a printed circuit substrate and is ultimately mounted on a mainboard of an electronic device.

FIG. 5 is a schematic cross-sectional view illustrating a case in which a fan-in semiconductor package is mounted on a printed circuit substrate and is ultimately mounted on a mainboard of an electronic device.

Figure 6:
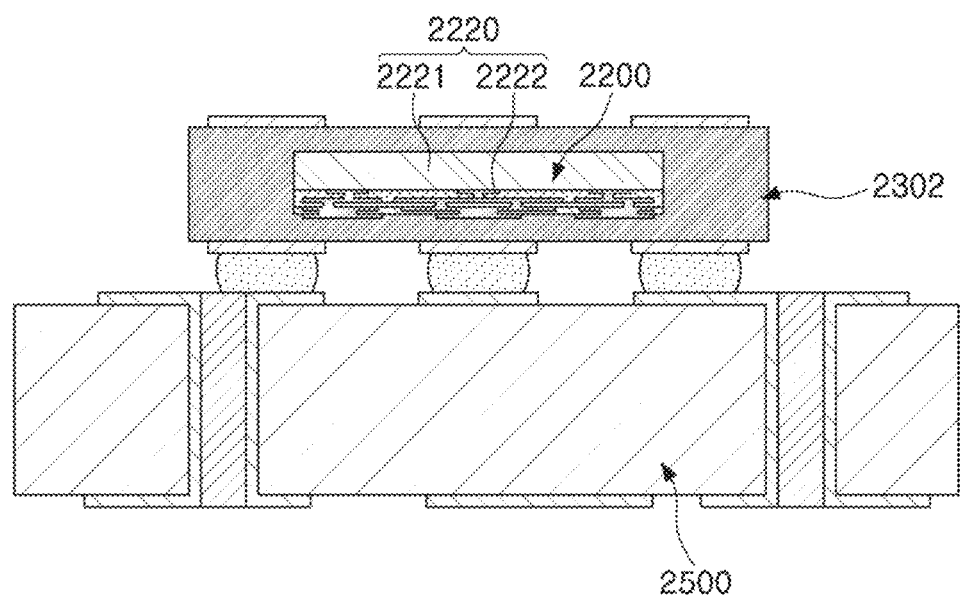
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
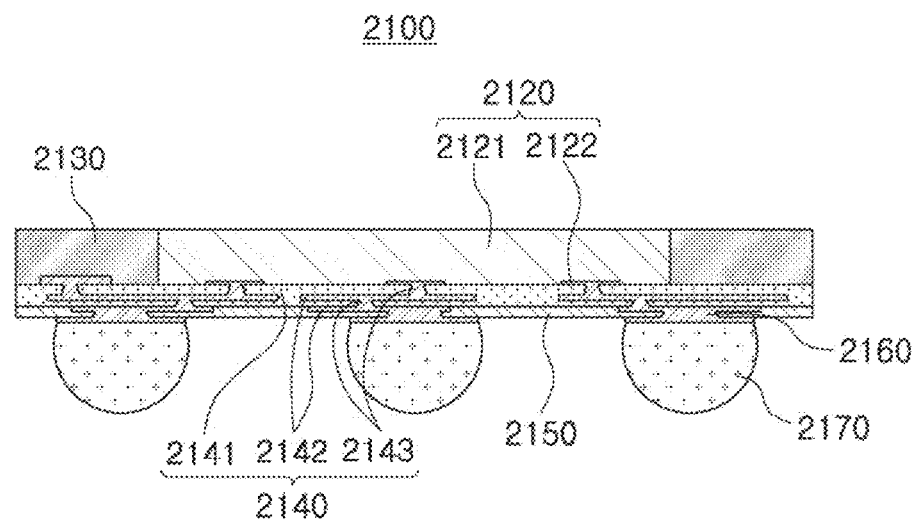
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
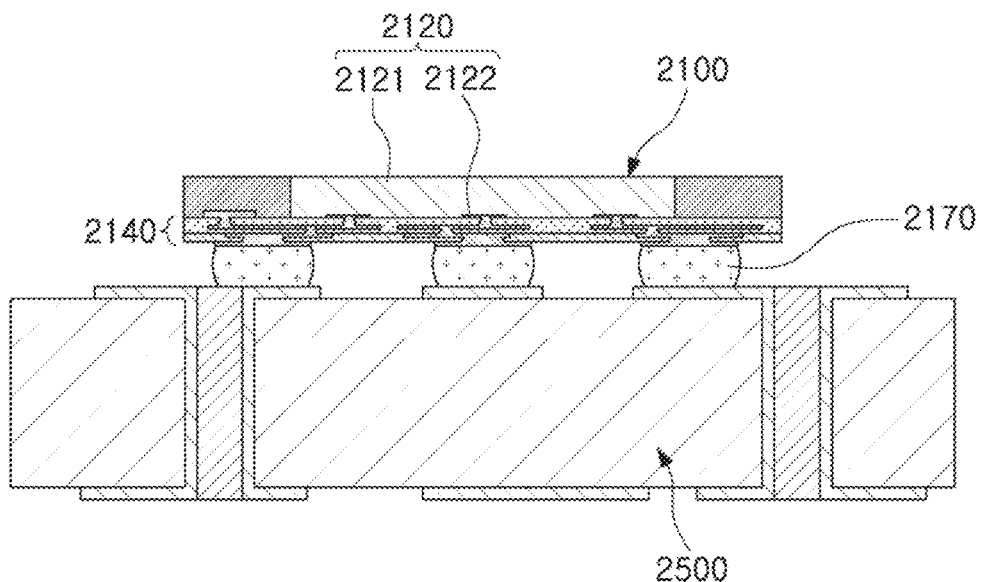
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is conceptually different from that of a printed circuit board (PCB), or the like, having a scale, a purpose, and the like, different from those of the fan-out semiconductor package, and having the fan-in semiconductor package embedded therein.

Semiconductor Package Module

Figure 9:
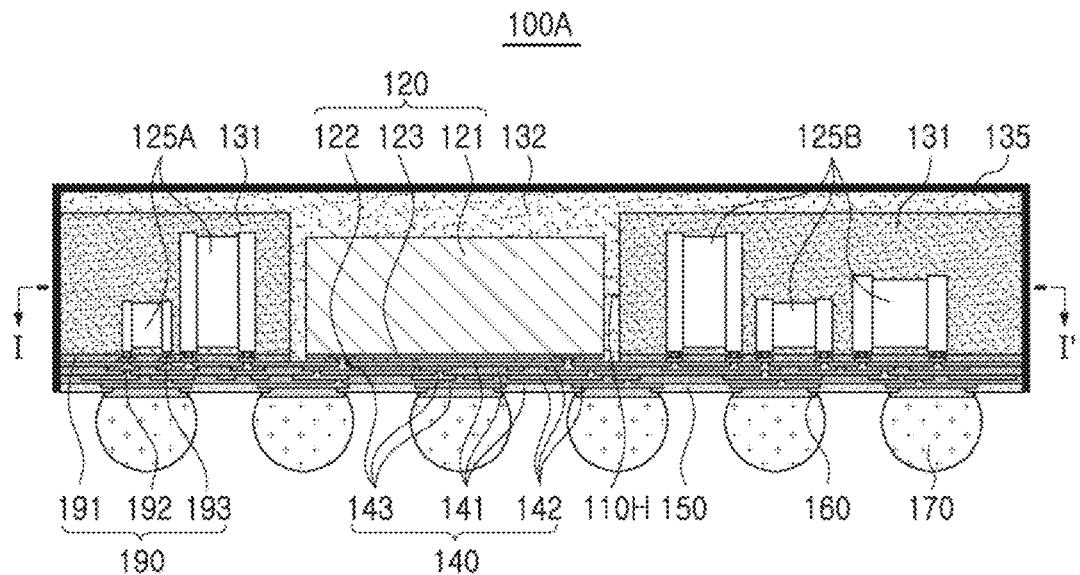
FIG. 9 is a schematic cross-sectional view illustrating an example of a fan-out semiconductor package module.

FIG. 9 is a schematic cross-sectional view illustrating an example of a fan-out semiconductor package module.

Figure 10:
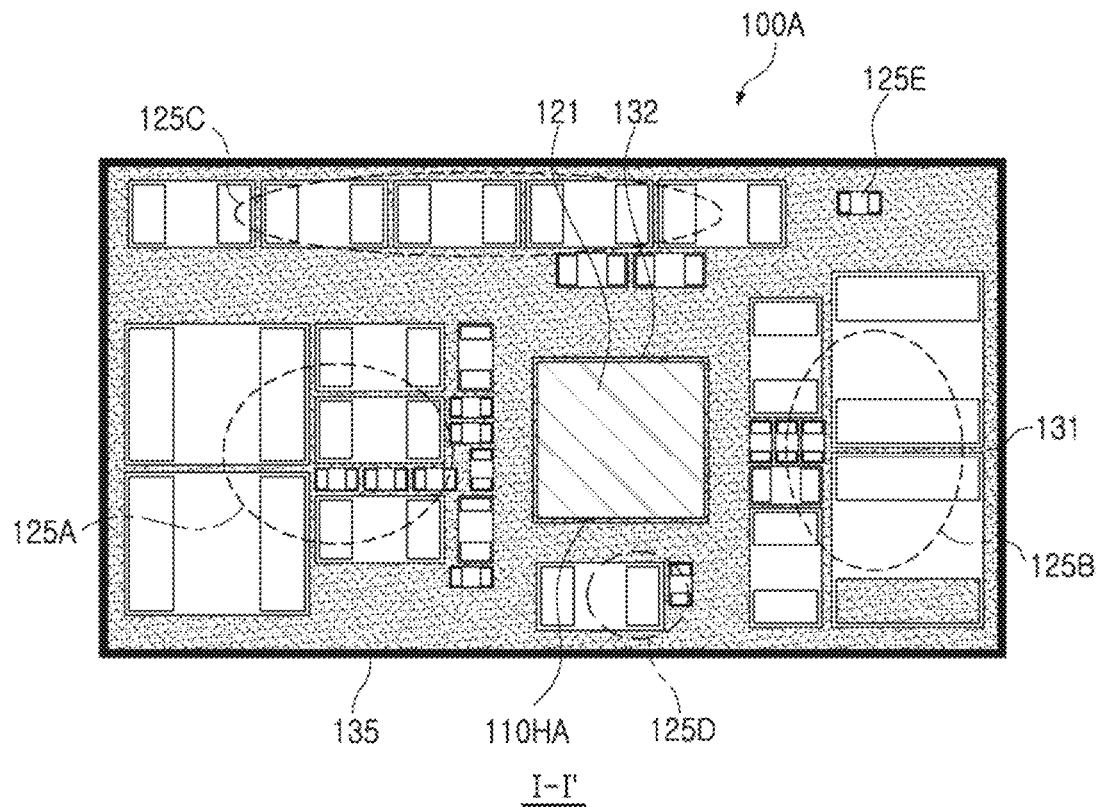
FIG. 10 is a schematic plan view taken along line I-I' of the fan-out semiconductor package module of FIG. 9.

FIG. 10 is a schematic plan view taken along line I-I' of the fan-out semiconductor package module of FIG. 9.

Referring to FIGS. 9 and 10, a fan-out semiconductor package module 100A according to an exemplary embodiment in the present disclosure may include one or more first passive components 125A, one or more second passive components 125B, one or more third passive components 125C, one or more fourth passive components 125D, one or more fifth passive components 125E, a first encapsulant 131 encapsulating at least portions of each of the first to fifth passive components 125A, 125B, 125C, 125D, and 125E, a semiconductor chip 120 disposed side-by-side with the first to fifth passive components 125A, 125B, 125C, 125D, and 125E and having an active surface having connection pads 122 disposed thereon and an inactive surface opposing the active surface, a second encapsulant 132 encapsulating at least portions of the semiconductor chip 120, a wiring member 190 disposed beneath the first to fifth passive components 125A, 125B, 125C, 125D, and 125E and including wiring patterns 192 electrically connected to the first to fifth passive components 125A, 125B, 125C, 125D, and 125E, and a connection member 140 disposed beneath the wiring member 190 and the semiconductor chip 120 to support the semiconductor chip 120 and the first to fifth passive components 125A, 125B, 125C, 125D, and 125E and including a redistribution layer 142 electrically connected to the connection pads 122 and the wiring patterns 192. A through-hole 110H may be formed in the first encapsulant 131 and the wiring member 190, the semiconductor chip 120 may be disposed in the through-hole 110H, and the second encapsulant 132 may fill at least portions of the through-hole 110H. In addition, if necessary, the fan-out semiconductor package module 100A may further include a passivation layer 150 disposed on the connection member 140, an underbump metal layer 160 formed in openings of the passivation layer 150 and electrically connected to the redistribution layer 142, and electrical connection structures 170 disposed on the underbump metal layer 160 and electrically connected to the redistribution layer 142 through the underbump metal layer 160. Meanwhile, the first to fifth passive components 125A, 125B, 125C, 125D, and 125E, the first encapsulant 131, and the wiring member 190 are collectively referred to one structure. For example, the structure may have the through-hole 110H penetrating through the first encapsulant 131 and the wiring member 190, and the semiconductor chip 120 may be disposed in the through-hole 110H of the structure.

Recently, in accordance with an increase in a size of displays for mobile apparatuses, the necessity to increase capacity of batteries has increased. In accordance with the increase in the capacity of the battery, an area occupied by the battery in the mobile apparatus has increased, and it has been thus required to reduce a size of a printed circuit board (PCB). Therefore, an area in which components are mounted has reduced, such that an interest in modularization has continuously increased. An example of the related art of mounting a plurality of components may include chip on board (COB) technology. A COB manner is a manner of mounting individual passive elements and a semiconductor package on a printed circuit board using surface mount technology (SMT). Such a manner has an advantage in terms of a cost, but a wide mounted area is required in order to maintain a minimum interval between components, electromagnetic interference (EMI) between the components is large, and a distance between the semiconductor chip and the components is great, such that electrical noise is increased.

On the other hand, in the fan-out semiconductor package module 100A according to the exemplary embodiment, a plurality of passive components 125A, 125B, 125C, 125D, and 125E may be disposed and modularized together with the semiconductor chip 120 in a single package. Therefore, an interval between the components may be significantly reduced, and a mounted area of the components on a printed circuit board such as a motherboard, or the like, may thus be significantly reduced. In addition, electrical paths between the semiconductor chip 120 and the passive components 125A, 125B, 125C, 125D, and 125E may be significantly reduced to suppress noise. Particularly, the semiconductor chip 120 and the passive components 125A, 125B, 125C, 125D, and 125E may be subjected to encapsulation processes of two steps rather than an encapsulation process of one step, and a mounting yield, an influence by foreign materials, or the like, depending on mounting of the passive components 125A, 125B, 125C, 125D, and 125E may be significantly reduced.

In detail, in a case of the passive components 125A, 125B, 125C, 125D, and 125E, a surface mounted process is relatively easy, but in a case of the semiconductor chip 120, a surface mounted process is relatively difficult. For example, the surface mounted process of the semiconductor chip 120 requires high precision and a clean environment. Therefore, when a process of mounting and encapsulating the passive components 125A, 125B, 125C, 125D, and 125E and a process of mounting and encapsulating the semiconductor chip 120 are separately performed, a mounting yield, an influence by foreign materials, or the like, between the passive components 125A, 125B, 125C, 125D, and 125E and the semiconductor chip 120 may be significantly reduced. Particularly, the semiconductor chip 120 that is relatively expensive may be mounted and encapsulated in only separate good units by a precise process after the passive components 125A, 125B, 125C, 125D, and 125E are mounted and encapsulated, such that a yield may be improved. In addition, the passive components 125A, 125B, 125C, 125D, and 125E and/or the semiconductor chip 120 showing various thickness differences maybe stably fixed, and several problems due to a thickness deviation may be solved.

In addition, in the fan-out semiconductor package module 100A according to the exemplary embodiment, the passive components 125A, 125B, 125C, 125D, and 125E may be disposed on the wiring member 190. That is, the wiring member 190 is introduced, and general surface mounting type components rather than embedded type components may thus be used as the passive components 125A, 125B, 125C, 125D, and 125E. In this case, the passive components 125A, 125B, 125C, 125D, and 125E may be mounted and disposed on the wiring member 190 using solder bonding, or the like, and a mounting defect problem such as fly of the passive components 125A, 125B, 125C, 125D, and 125E, a problem that the electrode pads are not exposed due to the mounting defect problem, or the like, may thus be suppressed.

The respective components included in the fan-out semiconductor package module 100A according to the exemplary embodiment will be described hereinafter in more detail.

The semiconductor chip 120 may be an integrated circuit (IC) provided in an amount of several hundreds to several millions of elements or more integrated in a single chip. In this case, the integrated circuit may be, for example, a power management IC (PMIC), but is not limited thereto. Meanwhile, the semiconductor chip 120 may be an integrated circuit in a bare state in which a separate bump or redistribution layer is not formed. In this case, the semiconductor chip 120 may be in physical contact with vias 143 of the connection member 140. The integrated circuit may be formed on the basis of an active wafer. In this case, a base material of a body 121 of the semiconductor chip may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. An insulating layer (not illustrated), and the like, maybe further disposed in other required positions.

The passive components 125A, 125B, 125C, 125D, and 125E may be multilayer ceramic capacitors (MLCCs), low inductance chip capacitors (LICCs), inductors, beads, or the like, respectively. The passive components 125A, 125B, 125C, 125D, and 125E may have different thicknesses. In addition, the passive components 125A, 125B, 125C, 125D, and 125E may have thicknesses different from that of the semiconductor chip 120. In the fan-out semiconductor package module 100A according to the exemplary embodiment, the passive components 125A, 125B, 125C, 125D, and 125E and the semiconductor chip 120 are encapsulated by two or more steps, and a defect problem due to a thickness deviation may thus be significantly reduced. The number of passive components 125A, 125B, 125C, 125D, and 125E is not particularly limited, and may be more than that illustrated in the drawings or be less than that illustrated in the drawings.

The wiring member 190 may include an insulating layer 191, the wiring patterns 192 embedded in the insulating layer 191 so that lower surfaces thereof are exposed by the insulating layer 191, and low melting point metals 193 disposed on the wiring patterns 192 and at least partially covered with the insulating layer 191. The passive components 125A, 125B, 125C, 125D, and 125E may be surface-mounted through the low melting point metals 193. That is, general surface mounting type components may be used as the passive components 125A, 125B, 125C, 125D, and 125E. The low melting point metal 193 may be a material having a melting point lower than that of a metal such as copper (Cu) or aluminum (Al), for example, tin (Sn) or an alloy including tin (Sn), more specifically, an alloy including tin (Sn), aluminum (Al), and copper (Cu), but is not limited thereto. The low melting point metal 193 may be a material used for solder bonding. Here, solder means that a base material is not melted and only a filler metal is melted. That is, the low melting point metal is not necessary limited to a tin (Sn)-lead (Pb) based alloy. Meanwhile, a barrier layer (not illustrated) formed of Ti—Cu, a thin ABF, or the like, may be formed on the exposed lower surfaces of the wiring patterns 192 in order to significantly reduce a recess depth depending on etching of a metal foil 202 to be described below. A lower surface of the insulating layer 191 of the wiring member 190 may be disposed on a level that is substantially the same as that of the active surface of the semiconductor chip 120. The term "same level" is used as a concept including a case in which levels are approximately the same as each other as well as a case in which levels are completely the same as each other.

The first encapsulant 131 may encapsulate at least portions of each of the passive components 125A, 125B, 125C, 125D, and 125E. The first encapsulant 131 may include an insulating material. The insulating resin may be a material including an inorganic filler and an insulating resin, for example, a thermosetting resin such as an epoxy resin, a thermoplastic resin such as a polyimide resin, a resin having a reinforcement material such as a glass fiber or an inorganic filler impregnated in the thermosetting resin and the thermoplastic resin, more specifically, prepreg, Ajinomoto Build up Film (ABF), FR-4, Bismaleimide Triazine (BT), or the like. In addition, the known molding material such as an epoxy molding compound (EMC), or the like, may be used, and a photosensitive material, that is, a photoimagable encapsulant (PIE) may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

The second encapsulant 132 may encapsulate at least portions of the semiconductor chip 120. In addition, the second encapsulant 132 may fill at least portions of the through-hole 110H. In addition, the second encapsulant 132 may cover at least portions of the first encapsulant 131. For example, the second encapsulant 132 may cover an upper surface of the first encapsulant 131. The second encapsulant 132 may also include the insulating material described above. The first encapsulant 131 and the second encapsulant 132 may include the same material or include different materials. Even though the first encapsulant 131 and the second encapsulant 132 include the same material, a boundary between the first encapsulant 131 and the second encapsulant 132 may be apparent. The first encapsulant 131 and the second encapsulant 132 may include similar materials, but may have different colors. For example, the first encapsulant 131 may be more transparent than the second encapsulant 132. That is, the boundary between the first encapsulant 131 and the second encapsulant 132 may be apparent.

The connection member 140 may redistribute the connection pads 122 of the semiconductor chip 120. In addition, the connection member 140 may electrically connect the semiconductor chip 120 and the passive components 125A, 125B, 125C, 125D, and 125E to each other. Several tens to several hundreds of connection pads 122 of the semiconductor chip 120 having various functions may be redistributed by the connection member 140, and may be physically or electrically externally connected through the electrical connection structures 170 depending on the functions. The connection member 140 may include insulating layers 141, the redistribution layers 142 disposed on the insulating layers 141, and the vias 143 penetrating through the insulating layers 141 and connecting the redistribution layers 142 to each other. The connection member 140 may be formed of a single layer, or may be formed of a plurality of layers of which the number is more than that illustrated in the drawings.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 122, the passive components 125A, 125B, 125C, 125D, and 125E, or the like, formed on different layers to each other, resulting in an electrical path in the fan-out semiconductor package module 100A. The vias 143 may be in physical contact with the connection pads 122. That is, the semiconductor chip 120, which is in a bare die type, may be directly connected to the vias 143 of the connection member 140 in a state in which separate bumps, or the like, do not exist. The passive components 125A, 125B, 125C, 125D, and 125E of which a surface mounting type using solder bumps, or the like, is an embedded type, may be connected to the vias 143 of the connection member 140 through the low melting point metals 193 and the wiring patterns 192. In this case, terminals or external electrodes of the passive components 125A, 125B, 125C, 125D, and 125E may be connected to the vias 143 of the connection member 140 through the bumps, the low melting point metals 193, and the wiring patterns 192. Lower surfaces of the wiring patterns 192 and the insulating layer 191 of the wiring member 190 and a lower surface of the passivation layer 123 of the semiconductor chip 120 may be coplanar with each other or substantially coplanar with each other. "Substantially" or "approximately" means that tolerance/errors/variations caused by manufacturing processes are considered to define a respective relationship. Since the connection pads 122 of the semiconductor chip 120 may be above the lower surface of the passivation layer 123, the vias 143 that are in direct contact with the connection pads 122 of the semiconductor chip 120 may have a thickness greater than a thickness of the vias 143 that are in direct contact with the wiring patterns 192. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

The passivation layer 150 may protect the connection member 140 from external physical or chemical impacts. The passivation layer 150 may have the openings exposing at least portions of the redistribution layer 142 of the connection member 140. The number of openings formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

The underbump metal layer 160 may improve connection reliability of the electrical connection structures 170 to improve board level reliability of the fan-out semiconductor package module 100A. The underbump metal layer 160 may be connected to the redistribution layer 142 of the connection member 140 exposed through the openings of the passivation layer 150. The underbump metal layer 160 maybe formed in the openings of the passivation layer 150 by the known metallization method using the known conductive material such as a metal, but is not limited thereto.

The electrical connection structures 170 may be additionally configured to physically or electrically externally connect the fan-out semiconductor package module 100A. For example, the fan-out semiconductor package module 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, and may be sufficiently modified depending on design particulars by those skilled in the art. For example, the electrical connection structures 170 may be provided in an amount of several tens to several millions according to the number of connection pads 122, or may be provided in an amount of several tens to several millions or more or several tens to several millions or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

If necessary, outer surfaces of the fan-out semiconductor package module 100A according to the exemplary embodiment may be covered with a metal layer 135. The metal layer 135 maybe formed by a plating process using sputter. The metal layer 135 may include a metal such as copper (Cu). Electromagnetic interference (EMI) blocking and heat dissipation effects may be improved by introducing the metal layer 135.

Figure 11A:
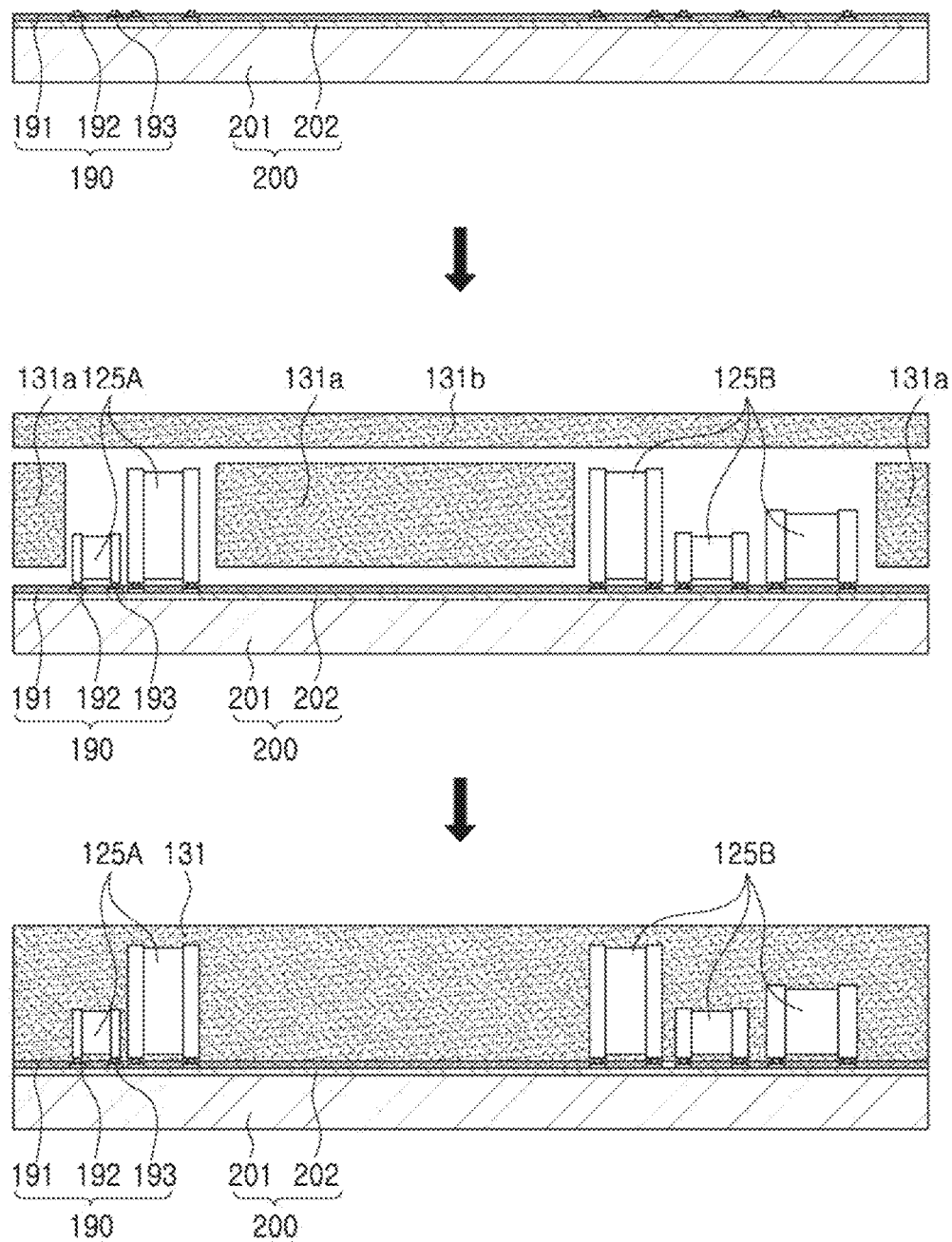
FIGS. 11A through 11C are schematic views illustrating an example of processes of manufacturing the fan-out semiconductor package module of FIG. 9.
Figure 11B:
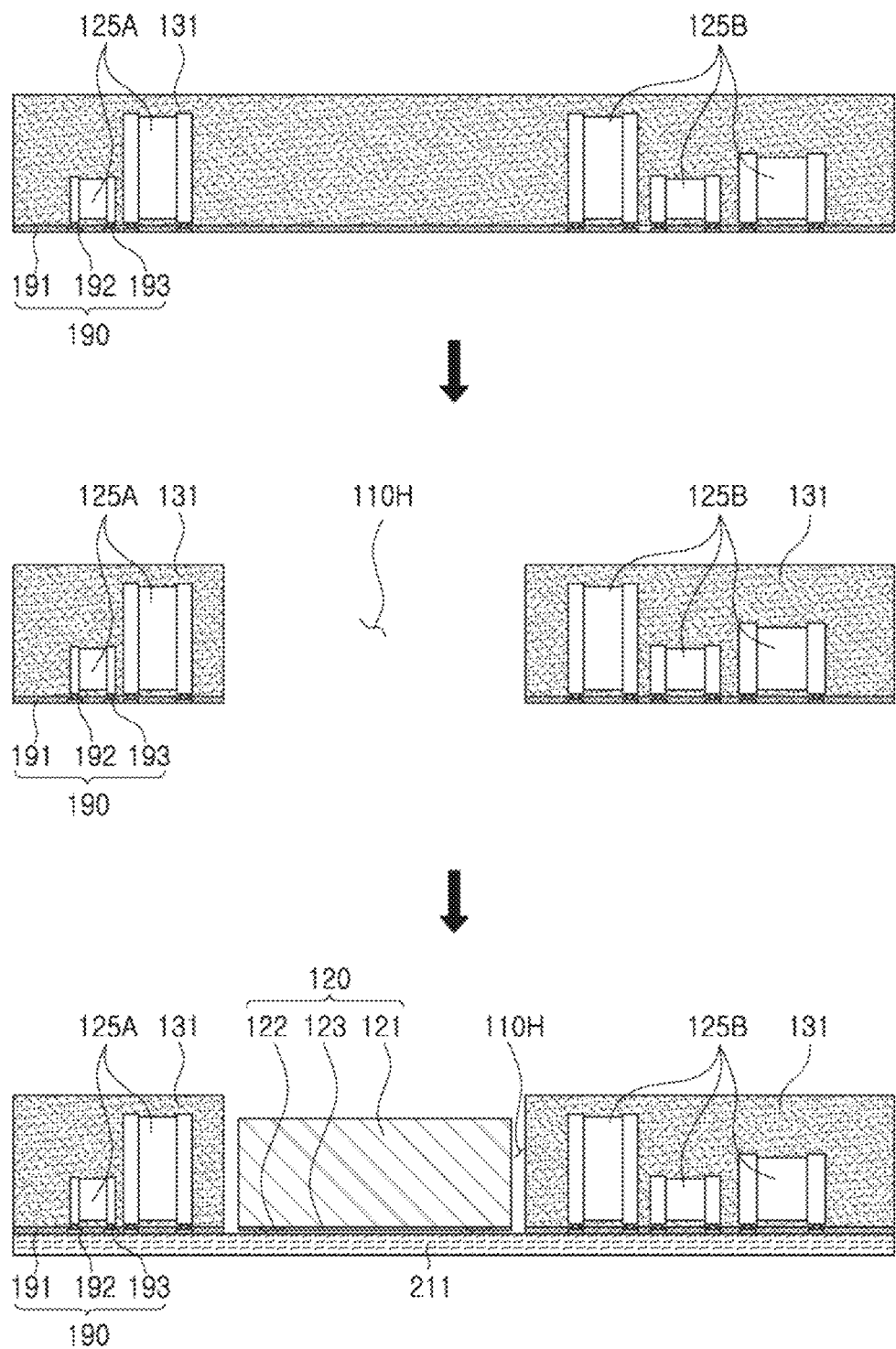
Figure 11C:
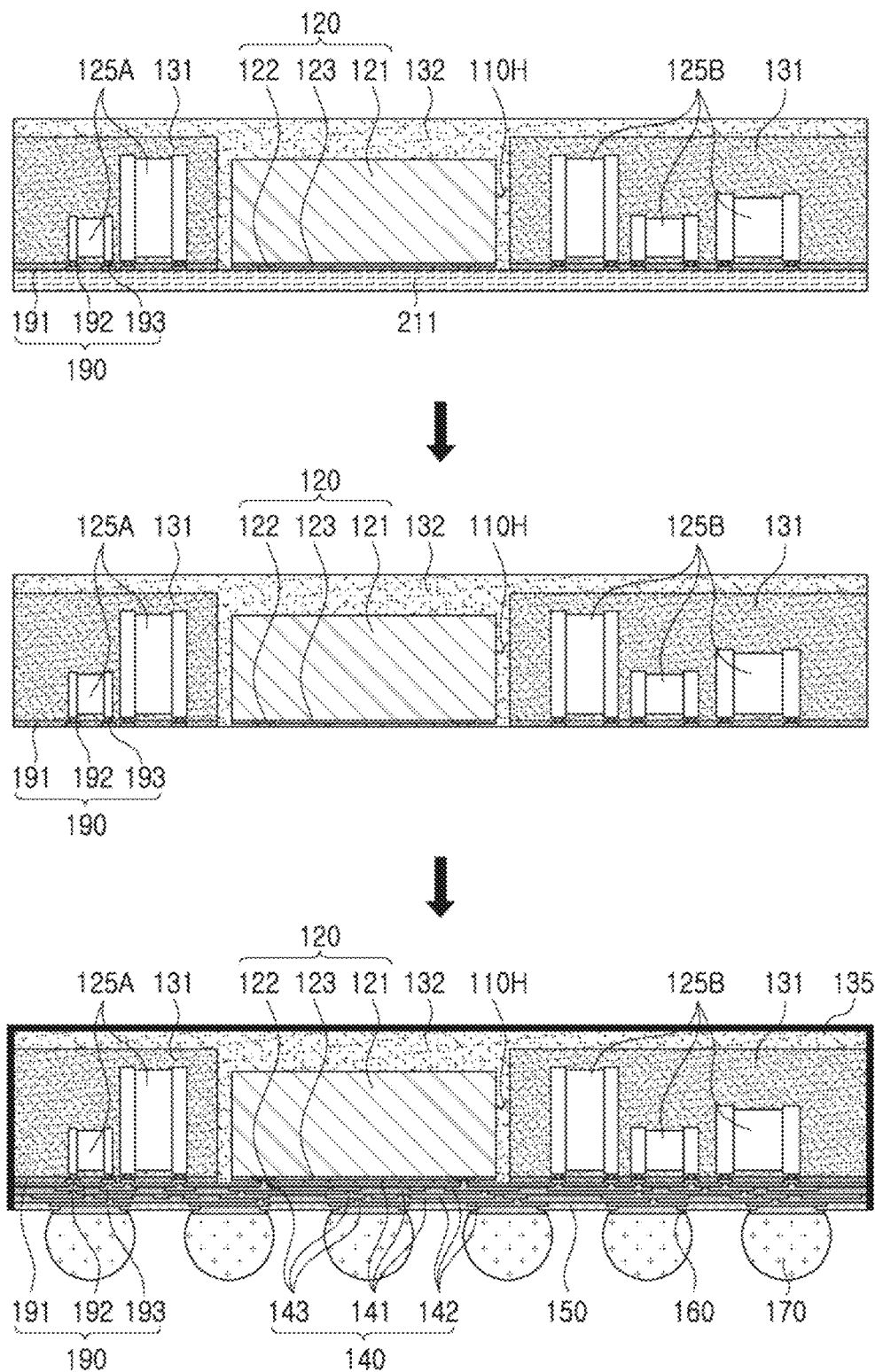

FIGS. 11A through 11C are schematic views illustrating an example of processes of manufacturing the fan-out semiconductor package module of FIG. 9.

Referring to FIG. 11A, the wiring member 190 may be first prepared. The wiring member 190 may be formed using a carrier substrate 200 including a support layer 201 and a metal foil 202 formed on at least one surface of the support layer 201. For example, the wiring member 190 may be formed by forming the wiring patterns 192 by a plating process using the metal foil 202 of the carrier substrate 200 as a seed layer, forming the insulating layer 191 on the metal foil 202 to cover the wiring patterns 192, forming openings exposing at least portions of the wiring patterns 192 in the insulating layer 191, and forming the low melting point metals 193 in the openings. Meanwhile, the low melting point metals 193 may protrude upwardly of an upper surface of the insulating layer 191. Meanwhile, the support layer 201 may be prepreg, and the metal foil 202 may be a plurality of coil foils. However, the support layer 201 and the metal foil 202 are not limited thereto. Then, each of the passive components 125A, 125B, 125C, 125D, and 125E may be surface-mounted on the wiring member 190. The passive components 125A, 125B, 125C, 125D, and 125E may be mounted in such a manner that the respective electrode pads are connected to the low melting point metals 193 by solder bonding, or the like. Then, the first encapsulant 131 may be formed by laminating prepreg, ABF, or the like. Materials 131a and 131b that are the same as or different from each other may be used for forming the first encapsulant 131. Then, the support layer 201 may be removed. In this case, when the metal foil 202 includes a plurality of layers, the support layer 201 may be removed by separating the metal foil 202.

Then, referring to FIG. 11B, the remaining metal foil 202 may be removed by etching, or the like. Then, the through-hole 110H penetrating through the first encapsulant 131 and the wiring member 190 may be formed. The through-hole 110H may be formed using a laser drill, a mechanical drill, or the like. In some case, a sandblast or a chemical method may also be used. Then, an adhesive film 211 may be attached on a lower surface of the wiring member 190, and the semiconductor chip 120 may be formed in a face-down form on the adhesive film 211 exposed through the through-hole 110H. The adhesive film 211 may be the known tape including an epoxy resin.

Then, referring to FIG. 11C, the second encapsulant 132 may be formed. The second encapsulant 132 may also be formed by laminating and then hardening prepreg or ABF. Then, the adhesive film 211 may be removed, and the connection member 140 maybe formed on the lower surface of the wiring member 190 from which the adhesive film 211 is removed and the active surface of the semiconductor chip 120. The connection member 140 may be formed by forming the insulating layers 141 by laminating or applying a PID, forming holes for the vias 143 by a photolithography method, and then forming the redistribution layers 142 and the vias 143 by the known plating method such as electroplating, electroless plating, or the like. Vias 143 of a first layer may be in physical contact with the lower surfaces of the wiring patterns 192 of the wiring member 190 and lower surfaces of the connection pads 122 of the semiconductor chip 120. That is, a first redistribution layer 142 may be electrically connected to the wiring patterns 192 and the connection pads 122 through the vias 143 of the first layer in physical contact with the exposed lower surfaces of the wiring patterns 192 and lower surfaces of the connection pads 122. Then, the passivation layer 150 may be formed by the known lamination method or applying method, the underbump metal layer 160 may be formed by the known metallization method, and the electrical connection structures 170 may be formed by the known method. If necessary, when the metal layer 135 is plated, the fan-out semiconductor package module 100A according to the exemplary embodiment described above may be manufactured.

Figure 12:
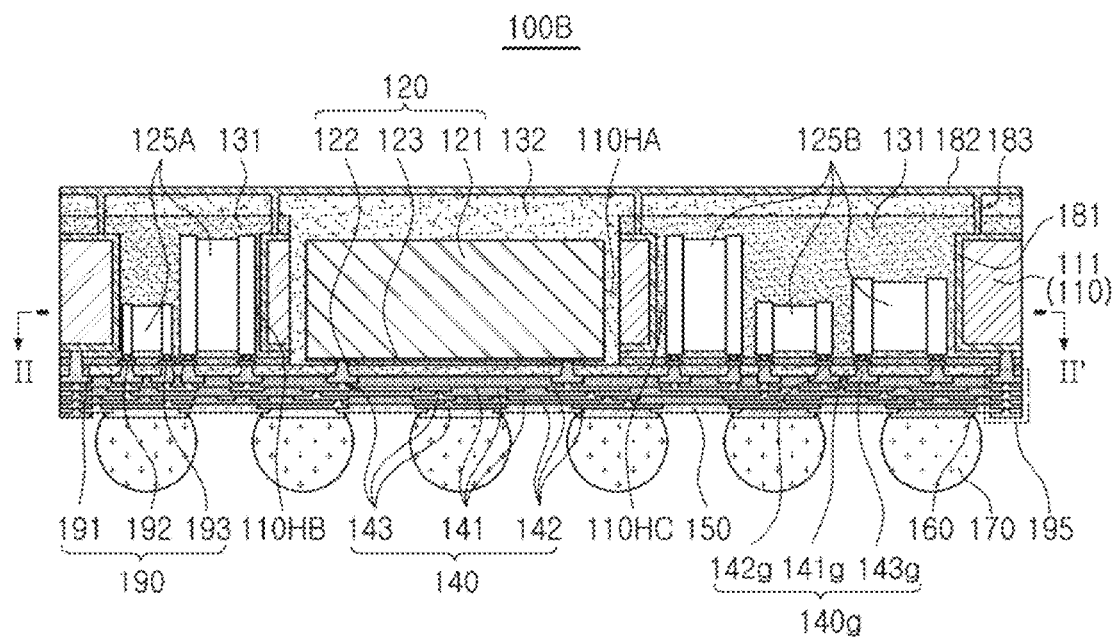
FIG. 12 is a schematic cross-sectional view illustrating another example of a fan-out semiconductor package module.

FIG. 12 is a schematic cross-sectional view illustrating another example of a fan-out semiconductor package module.

Figure 13:
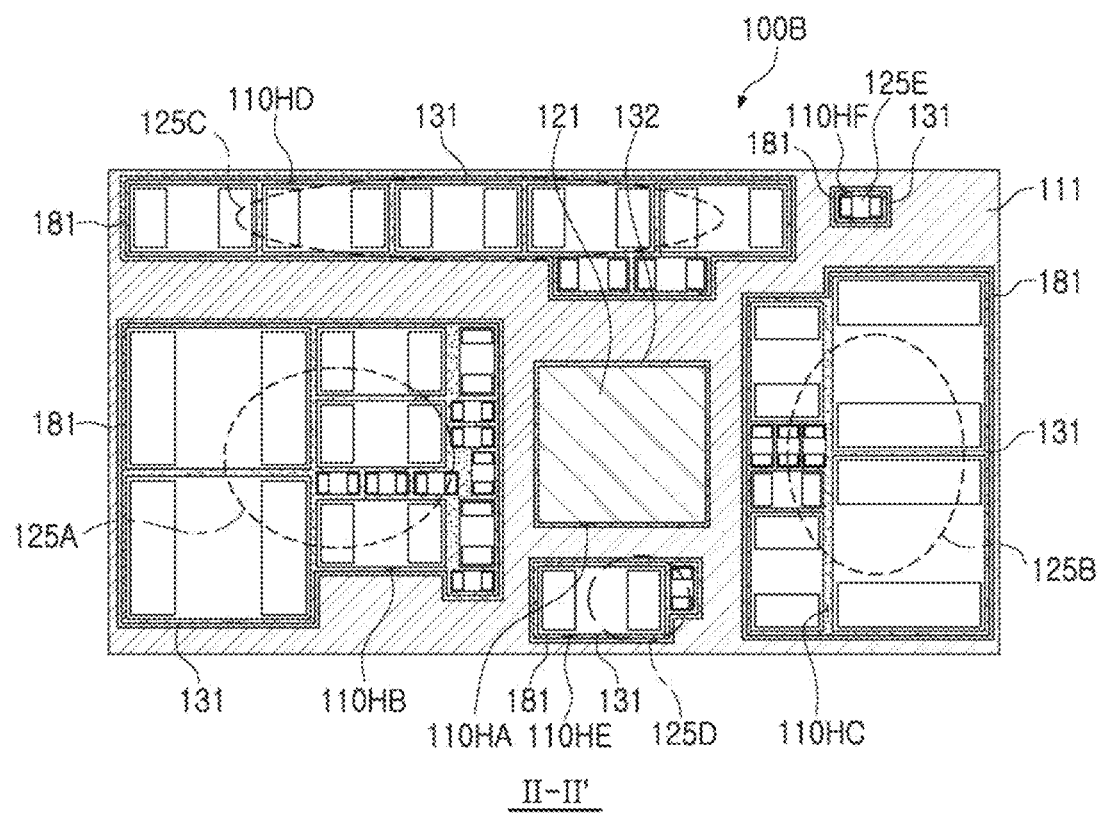
FIG. 13 is a schematic plan view taken along line II-II' of the fan-out semiconductor package module of FIG. 12.

FIG. 13 is a schematic plan view taken along line II-II' of the fan-out semiconductor package module of FIG. 12.

Referring to FIGS. 12 and 13, in a fan-out semiconductor package module 100B according to an exemplary embodiment in the present disclosure, the structure described above may further include a core member 110 having first to sixth through-holes 110HA, 110HB, 110HC, 110HD, 110HE, and 110HF. A semiconductor chip 120 may be disposed in the first through-hole 110HA. First to fifth passive components 125A, 125B, 125C, 125D, and 125E may be disposed in the second to sixth through-holes 110HB, 110HC, 110HD, 110HE, and 110HF, respectively. A first encapsulant 131 may encapsulate at least portions of the core member 110 and each of the first to fifth passive components 125A, 125B, 125C, 125D, and 125E, and fill at least portions of each of the second to sixth through-holes 110HB, 110HC, 110HD, 110HE, and 110HF. A second encapsulant 132 may encapsulate at least portions of the semiconductor chip 120, and fill at least portions of the first through-hole 110HA. In addition, the fan-out semiconductor package module 100B may further include metal layers 181, a backside metal layer 182, and backside vias 183 for blocking electromagnetic waves and dissipating heat. In addition, the fan-out semiconductor package module 100B may further include a circuit member 140g disposed between a wiring member 190 to support the semiconductor chip 120 and the first to fifth passive components 125A, 125B, 125C, 125D, and 125E, and the semiconductor chip 120 and a connection member 140 and electrically connecting connection pads 122 and wiring patterns 192 to a redistribution layer 142.

The core member 110 may improve rigidity of the fan-out semiconductor package module 100B depending on certain materials, and serve to secure uniformity of thicknesses of the first and second encapsulants 131 and 132. The core member 110 may have a plurality of through-holes 110HA, 110HB, 110HC, 110HD, 110HE, and 110HF. The plurality of through-holes 110HA, 110HB, 110HC, 110HD, 110HE, and 110HF may be physically spaced apart from each other. The semiconductor chip 120 and the passive components 125A, 125B, 125C, 125D, and 125E may be disposed in the plurality of through-holes 110HA, 110HB, 110HC, 110HD, 110HE, and 110HF, respectively. The semiconductor chip 120 and the passive components 125A, 125B, 125C, 125D, and 125E may be spaced apart from walls of the through-holes 110HA, 110HB, 110HC, 110HD, 110HE, and 110HF, respectively, by predetermined distances, and may be surrounded by the walls of the through-holes 110HA, 110HB, 110HC, 110HD, 110HE, and 110HF, respectively. However, a modification may be made, if necessary. The first through-hole 110HA may also penetrate through the first encapsulant 131 and the wiring member 190 as well as the core member 110.

The core member 110 may include an insulating layer 111. A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like.

The circuit member 140g may serve to primarily redistribute connection pads of the passive components 125A, 125B, 125C, 125D, and 125E and the semiconductor chip 120 before the connection member 140 is formed. The circuit member 140g may include an insulating layer 141g, circuit patterns 142g, and vias 143g. The insulating layer 141g may be formed of ABF. In this case, a thickness of the circuit pattern 142g may be greater than that of the redistribution layer 142 of the connection member 140. The vias 143g may electrically connect the connection pads 122, the wiring patterns 192, the metal layers 181, and the like, to the circuit patterns 142g. The passive components 125A, 125B, 125C, 125D, and 125E of which a surface mounting type using solder bumps, or the like, is an embedded type, may be connected to the 143g of the circuit member 140g through low melting point metals 193 and wiring patterns 192. In this case, terminals or external electrodes of the passive components 125A, 125B, 125C, 125D, and 125E may be connected to the vias 143g of the circuit member 140g through the bumps, the low melting point metals 193, and the wiring patterns 192. Lower surfaces of the wiring patterns 192 and the insulating layer 191 of the wiring member 190 and a lower surface of a passivation layer 123 of the semiconductor chip 120 may be coplanar with each other or substantially coplanar with each other. Since the connection pads 122 of the semiconductor chip 120 may be above the lower surface of the passivation layer 123, the vias 143g that are in direct contact with the connection pads 122 of the semiconductor chip 120 may have a thickness greater than a thickness of the vias 143g that are in direct contact with the wiring patterns 192. Each of the circuit patterns 142g and the vias 143g may include the conductive material described above, such as copper (Cu), or the like, and may be formed by plating. The circuit patterns 142g may be connected to the metal layers 181 through the vias 143g to improve EMI blocking and heat dissipation effects.

The metal layers 181 may be formed in a plate shape on the walls of each of the through-holes 110HB, 110HC, 110HD, 110HE, and 110HF, and may surround the passive components 125A, 125B, 125C, 125D, and 125E. The metal layers 181 may extend in a plate shape to upper and lower surfaces of the core member 110. The backside metal layer 182 may be formed in a plate shape on the second encapsulant 132 to block an upper portion of the fan-out semiconductor package module 100B. Therefore, EMI blocking and heat dissipation effects may be significantly improved. The backside vias 183 may penetrate through at least portions of the first encapsulant 131 and the second encapsulant 132 to connect the metal layers 181 and the backside metal layer 182 to each other. The metal layers 181, the backside metal layer 182, and the vias 183 may include a conductive material such as copper (Cu), or the like, and may be formed by the known plating method, or the like. If necessary, the metal layers 181 and the backside metal layer 182 maybe connected as aground of the redistribution layer 142 of the connection member 140 to be thus used as a ground. A degassing hole for discharging moisture, gas, or the like, may be formed in the backside metal layer 182. To this end, the backside metal layer 182 may also have a mesh form. If necessary, a blocking structure (denoted by reference numeral 195) having a stack-via form may be formed along an edge of the connection member 140 in the connection member 140. In this case, EMI blocking for the redistribution layer 142 of the connection member 140 may be implemented. The blocking structure 195 may be connected to the metal layers 181 and the backside metal layer 182 through the circuit patterns 142g and the vias 143g of the circuit member 140g and may also be connected to the ground of the redistribution layer 142 of the connection member 140.

Metal layer plating may not be performed on the walls of the through-hole 110HA in which the semiconductor chip 120 is disposed. That is, the walls of the through-hole 110HA may be in physical contact with the second encapsulant 132. This may be implemented by first forming the through-holes 110HB, 110HC, 110HD, 110HE, and 110HF, performing plating to form the metal layers 181, disposing the passive components 125A, 125B, 125C, 125D, and 125E in the through-holes 110HB, 110HC, 110HD, 110HE, and 110HF, respectively, forming the through-hole 110HA in the absence of a defect, and then disposing the semiconductor chip 120 in the through-hole 110HA. Alternatively, this may be implemented by forming the through-holes 110HA, 110HB, 110HC, 110HD, 110HE, and 110HF, performing plating in a state in which the through-hole 110HA is closed with a dry film, or the like, to form the metal layers 181, disposing the passive components 125A, 125B, 125C, 125D, and 125E in the through-holes 110HB, 110HC, 110HD, 110HE, and 110HF, respectively, opening the through-hole 110HA in the absence of a defect, and then disposing the semiconductor chip 120 in the through-hole 110HA. This may also be implemented by various other methods. When a process of mounting and encapsulating the passive components 125A, 125B, 125C, 125D, and 125E and a process of mounting and encapsulating the semiconductor chip 120 are separately performed, a mounting yield, an influence by foreign materials, or the like, between the passive components 125A, 125B, 125C, 125D, and 125E and the semiconductor chip 120 may be significantly reduced. Particularly, the semiconductor chip 120 that is relatively expensive may be mounted in only separate good units by a precise process after the passive components 125A, 125B, 125C, 125D, and 125E are mounted, such that a yield may be improved.

Descriptions of other configurations overlap that described above, and are thus omitted.

Figure 14A:
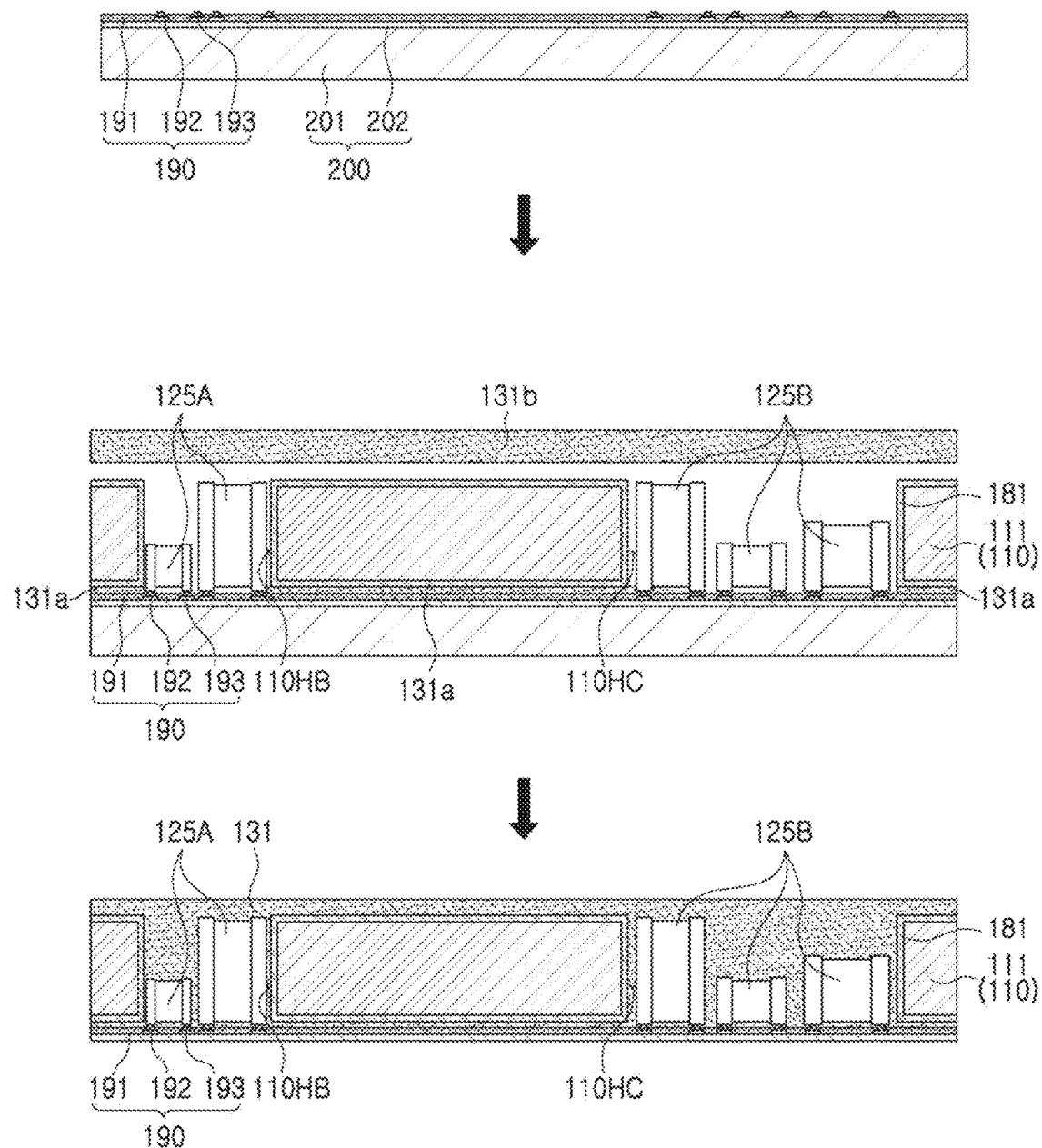
FIGS. 14A through 14C are schematic views illustrating an example of processes of manufacturing the fan-out semiconductor package module of FIG. 12.
Figure 14B:
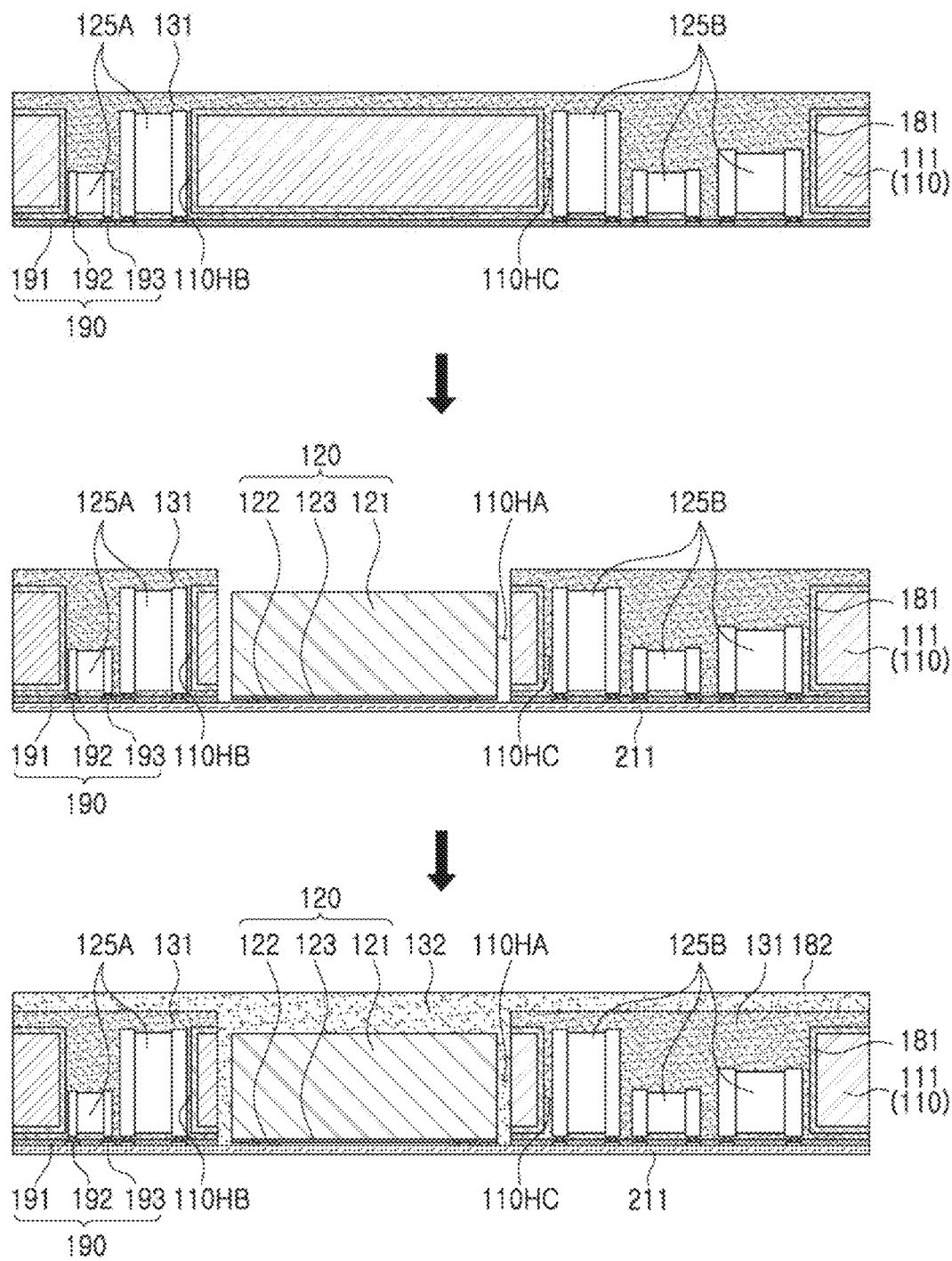
Figure 14C:
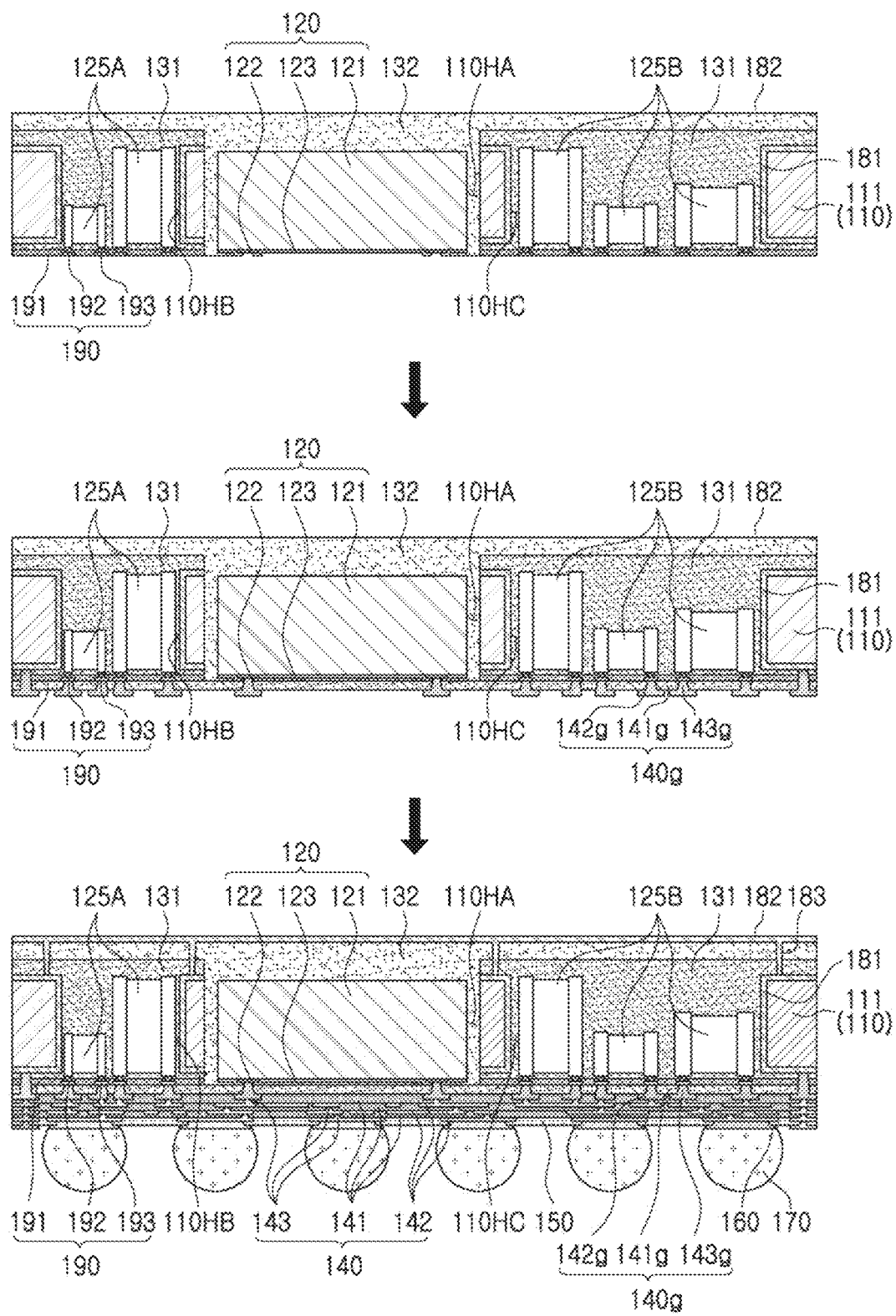

FIGS. 14A through 14C are schematic views illustrating an example of processes of manufacturing the fan-out semiconductor package module of FIG. 12.

Referring to FIG. 14A, the wiring member 190 may be prepared using a carrier substrate 200. Then, each of the passive components 125A, 125B, 125C, 125D, and 125E may be surface-mounted on the wiring member 190. In addition, the core member 110 having the through-holes 110HB, 110HC, 110HD, 110HE, and 110HF and having the metal layers 181 formed therein may be disposed on the carrier substrate 200. The passive components 125A, 125B, 125C, 125D, and 125E may be disposed in the through-holes 110HB, 110HC, 110HD, 110HE, and 110HF, respectively. In addition, the first encapsulant 131 may be formed using a plurality of materials 131a and 131b that are the same as or different from each other. Then, the support layer 201 may be removed.

Then, referring to FIG. 14B, the remaining metal foil 202 may be removed by etching, or the like. Then, the through-hole 110H penetrating through the core member 110, the first encapsulant 131, and the wiring member 190 may be formed. Then, an adhesive film 211 may be attached on a lower surface of the wiring member 190, and the semiconductor chip 120 may be formed in a face-down form on the adhesive film 211 exposed through the through-hole 110H.

Then, referring to FIG. 14C, the second encapsulant 132 may be formed. Then, the adhesive film 211 may be removed, and the circuit member 140g may be formed on the lower surface of the wiring member 190 from which the adhesive film 211 is removed and the active surface of the semiconductor chip 120. The circuit member 140g may be formed by forming the insulating layer 141g by laminating ABF, forming via holes by a laser drill and/or a mechanical drill, and then forming the vias 143g and the circuit patterns 142g by plating. Then, the connection member 140 may be formed on the circuit member 140g. In addition, the metal layers 181, the backside metal layer 182, and the vias 183 may be formed by a plating process. Then, when the passivation layer 150 and the electrical connection structures 170 are formed, the fan-out semiconductor package module 100B according to another exemplary embodiment described above may be manufactured.

Descriptions of other configurations overlap that described above, and are thus omitted.

Figure 15:
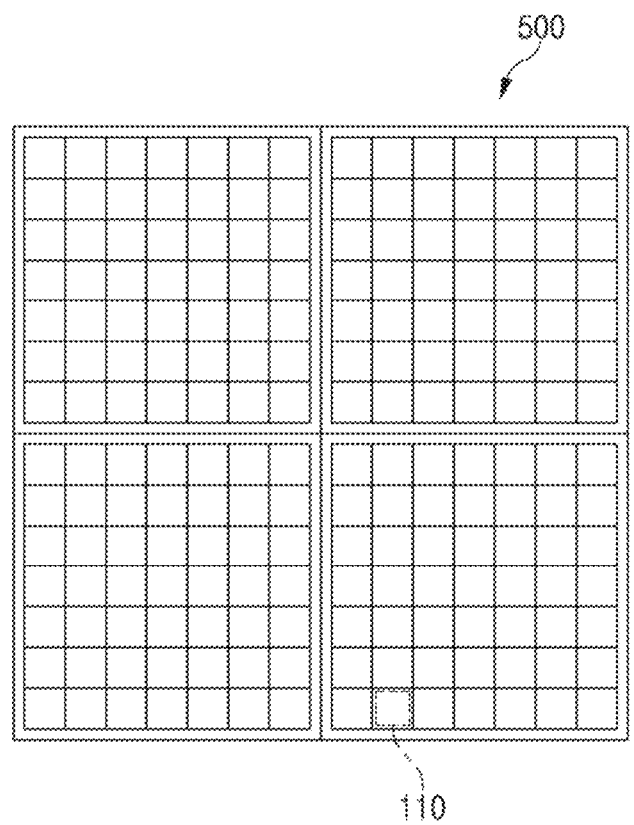
FIG. 15 is a schematic cross-sectional view illustrating an example of a panel used in the fan-out semiconductor package module of FIG. 9.

FIG. 15 is a schematic cross-sectional view illustrating an example of a panel used in the fan-out semiconductor package module of FIG. 9 or FIG. 12.

Referring to FIG. 15, the fan-out semiconductor module 100A or 100B according to exemplary embodiments may be manufactured using a panel 500 having a large size. A size of the panel 500 may be two to four times or more greater than that of a general wafer. Therefore, a larger number of fan-out semiconductor package modules 100A or 100B may be manufactured by performing processes once. That is, productivity may be significantly improved. Particularly, as sizes of the respective fan-out semiconductor package modules 100A or 100B become large, relative productivity may become high as compared to a case of using the wafer. After the plurality of fan-out semiconductor package modules 100A or 100B are simultaneously manufactured by performing processes once using the panel 500, the respective fan-out semiconductor package modules 100A or 100B may be obtained by sawing the plurality of fan-out semiconductor package modules 100A or 100B by the known sawing process such as a dicing process, or the like.

Figure 16:
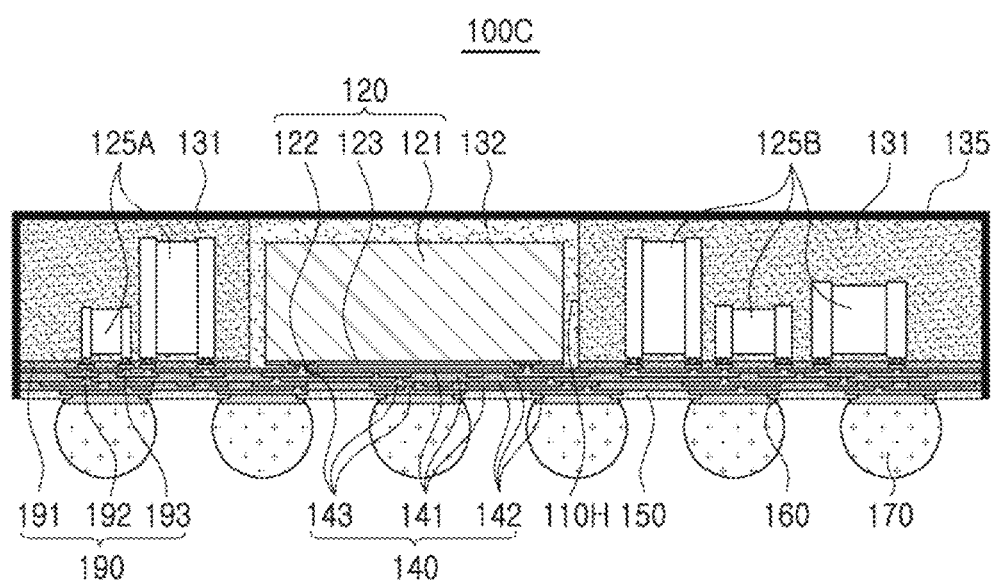
FIG. 16 is a schematic cross-sectional view illustrating another example of a fan-out semiconductor package module.

FIG. 16 is a schematic cross-sectional view illustrating another example of a fan-out semiconductor package module.

Referring to FIG. 16, a fan-out semiconductor package module 100C according to another exemplary embodiment may be substantially the same as the fan-out semiconductor package module 100A according to the exemplary embodiment described above except that a second encapsulant 132 does not cover a first encapsulant 131. Such a form may be implemented by forming the second encapsulant 132 in a UF jetting manner using a liquid phase material. Upper surfaces of the first encapsulant 131 and the second encapsulant 132 may be substantially coplanar with each other. That is, the upper surfaces of the first encapsulant 131 and the second encapsulant 132 may be disposed on the same level. The same level is a concept including a fine difference. That is, the same level means that levels are substantially the same as each other. In this case, a thickness of the fan-out semiconductor package module 100C may be significantly reduced. Descriptions of other configurations and manufacturing methods overlap those described above, and are thus omitted.

Figure 17:
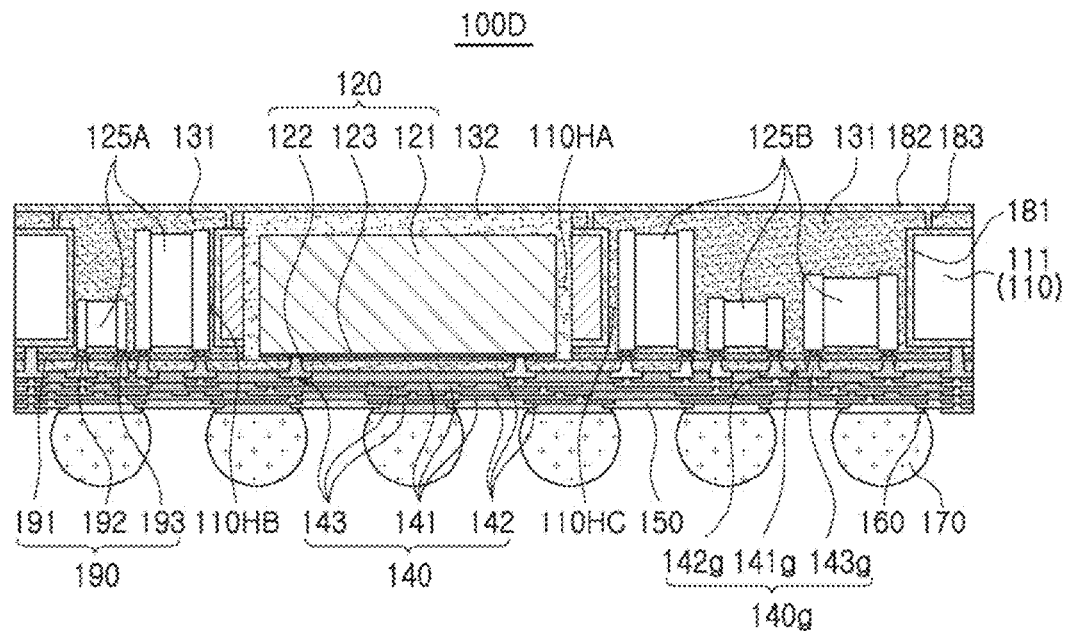
FIG. 17 is a schematic cross-sectional view illustrating another example of a fan-out semiconductor package module.

FIG. 17 is a schematic cross-sectional view illustrating another example of a fan-out semiconductor package module.

Referring to FIG. 17, a fan-out semiconductor package module 100D according to another exemplary embodiment may be substantially the same as the fan-out semiconductor package module 100B according to another exemplary embodiment described above except that a second encapsulant 132 does not cover a first encapsulant 131. Likewise, such a form may be implemented by forming the second encapsulant 132 in a UF jetting manner using a liquid phase material. In this case, upper surfaces of the first encapsulant 131 and the second encapsulant 132 may be substantially coplanar with each other. That is, the upper surfaces of the first encapsulant 131 and the second encapsulant 132 may be disposed on the same level. Meanwhile, the backside vias 183 do not penetrate through the second encapsulant 132, but may penetrate through only at least portions of the first encapsulant 131. Descriptions of other configurations and manufacturing methods overlap that described above, and are thus omitted.

Figure 18:
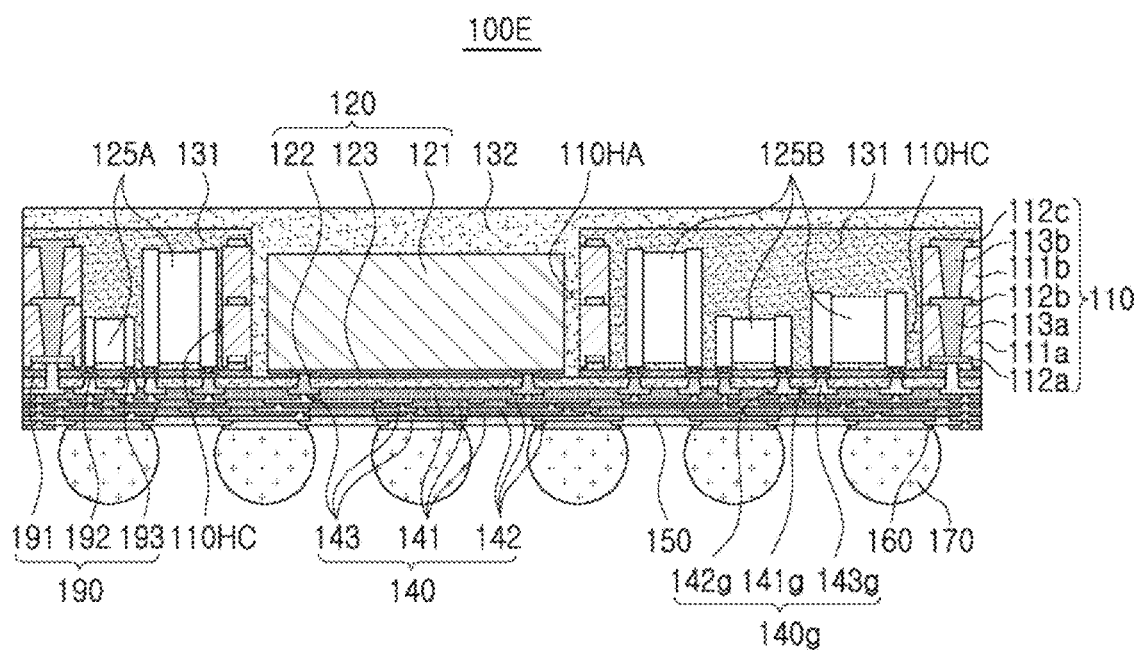
FIG. 18 is a schematic cross-sectional view illustrating another example of a fan-out semiconductor package module.

FIG. 18 is a schematic cross-sectional view illustrating another example of a fan-out semiconductor package module.

Referring to FIG. 18, a fan-out semiconductor package module 100E according to another exemplary embodiment may be substantially the same as the fan-out semiconductor package module 100B according to another exemplary embodiment described above except that a core member 110 includes a first insulating layer 111a, a first wiring layer 112a embedded in the first insulating layer 111a so that a lower surface thereof is exposed, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122 through a wiring member 190, a circuit member 140g, and a connection member 140. The first and second wiring layers 112a and 112b and the second and third wiring layers 112b and 112c may be electrically connected to each other through first and second vias 113a and 113b penetrating through the first and second insulating layers 111a and 111b, respectively. The reason is that the first wiring layer 112a may be recessed into the first insulating layer 111a. That is, the first wiring layer 112a may be recessed in the first insulating layer 111a, such that a lower surface of the first insulating layer 111a and a lower surface of the first wiring layer 112a may have a step therebetween. Thicknesses of the wiring layers 112a, 112b, and 112c of the core member 110 may be greater than those of the redistribution layers 142 of the connection member 140.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of a semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have all of the shapes known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

Meanwhile, the core member 110 of the fan-out semiconductor package module 100E according to another exemplary embodiment may also be applied to the fan-out semiconductor package module 100D according to another exemplary embodiment. Descriptions of other configurations and manufacturing methods overlap that described above, and are thus omitted.

Figure 19:
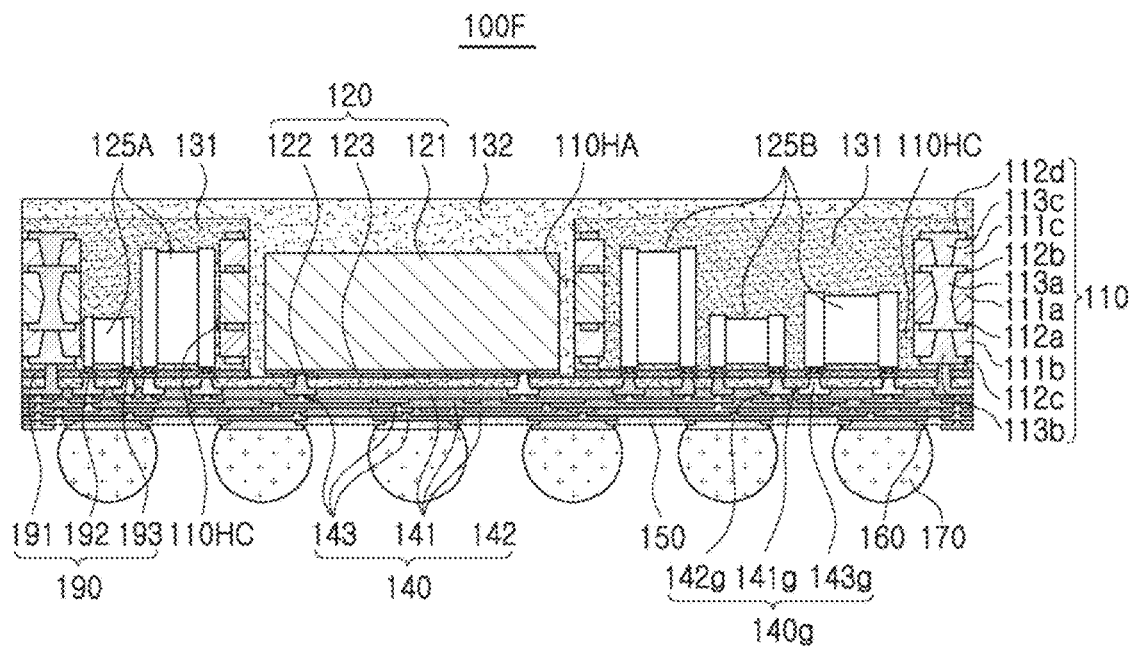
FIG. 19 is a schematic cross-sectional view illustrating another example of a fan-out semiconductor package module.

FIG. 19 is a schematic cross-sectional view illustrating another example of a fan-out semiconductor package module.

Referring to FIG. 19, a fan-out semiconductor package module 100F according to another exemplary embodiment in the present disclosure may be substantially the same as the fan-out semiconductor package module 100B according to another exemplary embodiment except that a core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122 through a wiring member 190, a circuit member 140g, and a connection member 140. Since the core member 110 may include a large number of wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may basically be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c. Thicknesses of the wiring layers 112a, 112b, 112c, and 112d of the core member 110 may be greater than those of the redistribution layers 142 of the connection member 140.

Meanwhile, the core member 110 of the fan-out semiconductor package module 100F according to another exemplary embodiment may also be applied to the fan-out semiconductor package module 100D according to another exemplary embodiment. Descriptions of other configurations and manufacturing methods overlap that described above, and are thus omitted.

Figure 20:
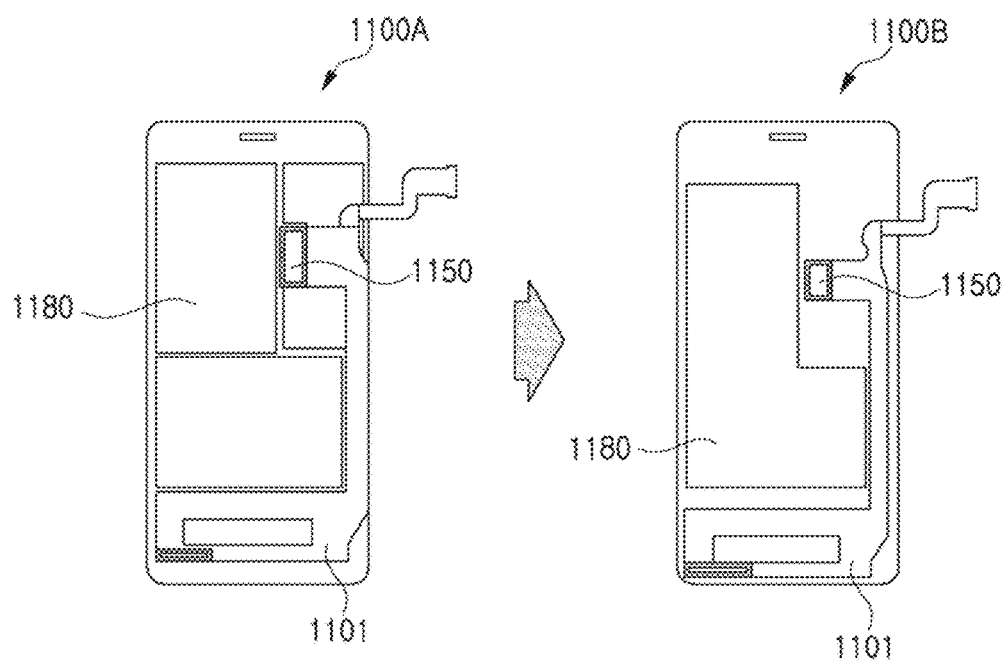
FIG. 20 is schematic plan views illustrating one effect in a case in which a fan-out semiconductor package module according to the present disclosure is used in an electronic device.

FIG. 20 is schematic plan views illustrating one effect in a case in which a fan-out semiconductor package module according to the present disclosure is used in an electronic device.

Referring to FIG. 20, recently, in accordance with an increase in a size of displays for mobile apparatuses 1100A and 1100B, the necessity to increase capacity of batteries has increased. In accordance with the increase in the capacity of the battery, an area occupied by the battery 1180 in the mobile apparatus has increased, and it has been thus required to reduce a size of a motherboard 1101. Therefore, an area in which components are mounted has reduced, such that an area that may be occupied by a module 1150 including a PMIC and passive components has continuously reduced. However, when the fan-out semiconductor package module 100A, 100B, 100C, 100D, and 100E, or 100F according to the present disclosure is used, a size of the module 1150 may be significantly reduced, and the reduced area as described above may thus be effectively used.

As set forth above, according to the exemplary embodiments in the present disclosure, a fan-out semiconductor package module in which amounted area of a semiconductor chip and a plurality of passive components may be significantly reduced, an electrical path between the semiconductor chip and the plurality of passive components may be significantly reduced, a yield problem may be solved, a problem occurring in mounting the passive components may be solved, and EMI blocking and heat dissipation effects may be easily implemented by plating may be provided While exemplary embodiments have been shown and described above, it will be apparent to those skilled in the art that modifications and variations could be made without departing from the scope of the present invention as defined by the appended claims.

What is claimed is:

1. A fan-out semiconductor package module comprising:
a structure including a wiring member including wiring patterns, one or more first passive components disposed on the wiring member and electrically connected to the wiring pattern, and a first encapsulant encapsulating at least portions of each of the one or more first passive components, and having a first through-hole penetrating through the wiring member and the first encapsulant;
a semiconductor chip disposed in the first through-hole of the structure and having an active surface having connection pads disposed thereon and an inactive surface opposing the active surface;
a second encapsulant encapsulating at least portions of the semiconductor chip and filling at least portions of the first through-hole; and
a connection member disposed on the structure and the active surface of the semiconductor chip and including a redistribution layer electrically connected to the connection pads and the wiring patterns.

2. The fan-out semiconductor package module of claim 1, wherein the one or more first passive components are electrically connected to the wiring patterns of the wiring member through low melting point metals.

3. The fan-out semiconductor package module of claim 2, wherein the low melting point metal includes tin (Sn).

4. The fan-out semiconductor package module of claim 2, wherein the wiring member includes an insulating layer, the wiring patterns embedded in the insulating layer and having lower surfaces thereof exposed by the insulating layer, and the low melting point metals disposed on the wiring patterns and at least partially covered with the insulating layer.

5. The fan-out semiconductor package module of claim 4, wherein the redistribution layer is electrically connected to the wiring patterns and the connection pads through vias of the connection member in physical contact with the exposed lower surfaces of the wiring patterns and lower surfaces of the connection pads.

6. The fan-out semiconductor package module of claim 5, wherein the vias of the connection member being in physical contact with the exposed lower surfaces of the wiring patterns have a thickness less than that of the vias of the connection member being in physical contact with the lower surfaces of the connection pads.

7. The fan-out semiconductor package module of claim 4, wherein a lower surface of the insulating layer and a lower surface of a passivation layer of the semiconductor chip are disposed on approximately the same level.

8. The fan-out semiconductor package module of claim 1, wherein the structure further includes a core member disposed on the wiring member and having the first through-hole and second through-holes spaced apart from the first through-hole,
the one or more first passive components are disposed in the second through-holes, and
the first encapsulant fills at least portions of the second through-holes.

9. The fan-out semiconductor package module of claim 8, further comprising metal layers disposed on walls of the second through-holes.

10. The fan-out semiconductor package module of claim 9, wherein the metal layers extend to upper and lower surfaces of the core member.

11. The fan-out semiconductor package module of claim 10, further comprising:
a backside metal layer disposed on at least one of the first encapsulant and the second encapsulant; and
backside vias penetrating through at least portions of at least one of the first encapsulant and the second encapsulant and connecting the metal layers and the backside metal layer to each other.

12. The fan-out semiconductor package module of claim 8, wherein the core member further has a third through-hole spaced apart from the first and second through-holes,
the structure further includes one or more second passive components disposed in the third through-hole on the wiring member, and
the first encapsulant encapsulates at least portions of the second passive components, and fills at least portions of the third through-hole.

13. The fan-out semiconductor package module of claim 8, further comprising a circuit member disposed between the wiring member, and the semiconductor chip and the connection member and electrically connecting connection pads and the wiring patterns to the redistribution layer.

14. The fan-out semiconductor package module of claim 8, wherein the core member includes a first insulating layer, a first wiring layer embedded in the first insulating layer so that one surface thereof is exposed, a second wiring layer disposed on the other surface of the first insulating layer opposing one surface of the first insulating layer in which the first wiring layer is embedded, a second insulating layer disposed on the first insulating layer and covering the second wiring layer, and a third wiring layer disposed on the second insulating layer, and
the first to third wiring layers are electrically connected to the wiring patterns.

15. The fan-out semiconductor package module of claim 8, wherein the core member includes a first insulating layer, a first wiring layer and a second wiring layer disposed on opposite surfaces of the first insulating layer, respectively, a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer, and
the first to fourth wiring layers are electrically connected to the wiring patterns.

16. The fan-out semiconductor package module of claim 1, wherein the second encapsulant covers an upper surface of the first encapsulant.

17. The fan-out semiconductor package module of claim 1, wherein upper surfaces of the first and second encapsulants are disposed on the approximately same level.

18. The fan-out semiconductor package module of claim 1, wherein the semiconductor chip includes a power management integrated circuit (PMIC), and
the one or more first passive components include capacitors.

19. The fan-out semiconductor package module of claim 1, wherein walls of the first through-hole are in physical contact with the second encapsulant.

20. A fan-out semiconductor package module comprising:
a support member including an insulating layer, a conductive layer disposed on the insulating layer, and first and second vias penetrating through the insulating layers and electrically connected to the conductive layers;
a passive component and a semiconductor chip disposed on the support member;
a first encapsulant encapsulating at least a portion of the passive component, and having a through-hole penetrating through the first encapsulant; and
a second encapsulant encapsulating at least a portion of the semiconductor chip and filling at least a portion of the through-hole,
wherein the semiconductor chip is disposed in the through-hole of the first encapsulant and has an active surface having connection pads disposed thereon and an inactive surface opposing the active surface,
the passive component is electrically connected to the first vias of the support member at least through solder bumps disposed between the first vias of the support member and the passive component, and
the connection pads of the semiconductor chip are in direct contact with the second vias of the support member.

* * * * *